United States Patent
Arao et al.

(10) Patent No.: US 6,632,346 B2
(45) Date of Patent: Oct. 14, 2003

(54) PROCESS FOR ELECTRODEPOSITING ZINC OXIDE FILM

(75) Inventors: Kozo Arao, Tokyo (JP); Noboru Toyama, Osaka (JP); Yuichi Sonoda, Nara (JP); Yusuke Miyamoto, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 124 days.

(21) Appl. No.: 09/897,947

(22) Filed: Jul. 5, 2001

(65) Prior Publication Data

US 2002/0048966 A1 Apr. 25, 2002

(30) Foreign Application Priority Data

Jul. 4, 2000 (JP) .......................... 2000-201863
Jul. 2, 2001 (JP) .......................... 2001-200808

(51) Int. Cl.$^7$ ............................ C25D 11/00; C25D 9/00
(52) U.S. Cl. .................... 205/333; 205/133; 205/134; 205/148; 205/305; 205/101
(58) Field of Search ..................... 205/133, 134, 205/148, 305, 333, 98, 101

(56) References Cited

U.S. PATENT DOCUMENTS

| | | | |
|---|---|---|---|
| 5,804,466 A | 9/1998 | Arao et al. | 438/95 |
| 6,224,736 B1 | 5/2001 | Miyamoto | 205/97 |
| 6,475,367 B1 * | 11/2002 | Toyama et al. | 205/96 |

* cited by examiner

Primary Examiner—Roy King
Assistant Examiner—Wesley A. Nicolas
(74) Attorney, Agent, or Firm—Fitzpatrick, Cella, Harper & Scinto

(57) ABSTRACT

The present process for electrodepositing a zinc oxide film comprises the steps of immersing a substrate and an opposing electrode in an electrodeposition bath which contains zinc nitrate and is kept heated, and forming the zinc oxide film on the substrate by passing a current between the substrate and the opposing electrode, wherein the process further includes a step of trapping the particles of zinc oxide precipitated in the electrodeposition bath by circulating or stirring the bath before the formation of the zinc oxide film, whereby the present process can prevent the generated zinc oxide powder from depositing on the surfaces of the substrate and the zinc oxide film formed by electrodeposition when restarting or starting the formation of a zinc oxide film by the electrodeposition using an electrodeposition apparatus, and hence the formation of a uniform zinc oxide film free from defects.

8 Claims, 9 Drawing Sheets

PROCESS FOR ELECTRODEPOSITING ZINC OXIDE FILM

BACKGROUND OF THE INVENTION

1. Field of the Invention

This invention relates to a process for electrodepositing a zinc oxide film which can be applied as a functional film to electronic devices such as a solar cell, and specifically to improvement of an electrodeposition process for obtaining an uniform zinc oxide film having no defect.

2. Related Background Art

U.S. Pat. No. 5,804,466 ("Process for production of zinc oxide thin film, and process for production of semiconductor device substrate and process for production of photoelectric conversion device using the same film", filed by Canon Kabushiki Kaisha on Sep. 8, 1998) discloses a process for forming a zinc oxide thin film, which comprises immersing a substrate and a counter electrode in an electrodeposition bath containing zinc nitrate maintained at a temperature of 50° C. or more and applying current between the substrate and the counter electrode to form a zinc oxide thin film on the substrate.

The above-described process is different from a sputtering process and a vacuum process, for example, a vacuum heating vapor deposition or chemical vapor deposition (CVD) method and makes it possible to form a zinc oxide film having at a low cost. The above-described process can form a film having an uneven surface with good controllability, and therefore when this process can be applied to formation of a reflection layer of a solar cell or an intermediate layer thereof, it is possible to utilize the optical confinement effect, thereby improving the efficiency of the solar cell. Further, this process makes it possible to produce a production apparatus of for a long substrate made of a metal at a low cost, and therefore this process can provide, for example, an excellent reflection layer in formation of a sola cell device.

On the basis of the idea as described above, the present inventors actually attempted to deposit a zinc oxide film on a long substrate such as of stainless steel (SUS) which was wound off from the substrate wound in a coil-like state. FIG. 2 is a schematic view for showing a general structure of an apparatus for depositing an oxide film by an electrodepositing method on the basis of the idea as described above. Its dividedly enlarged views are also given in FIGS. 3 to 9. In FIG. 2 and FIGS. 3 to 9, names and reference numerals of respective members are common. A procedure for forming or depositing an electrodeposited film on a long substrate by means of this apparatus is described below with reference to these drawings.

Roughly sectioned, the apparatus consists of a wind-off unit 2012 from which a long substrate wound in a coil-like state is wound off, a first electrodeposition tank 2066 in which a first electrodeposition film is deposited or treated, a second electrodeposition tank 2166 in which a second electrodeposition film is deposited or treated, a first circulation tank 2120 from which a heated electrodeposition bath is circulatingly fed to the first electrodeposition tank, a second circulation tank 2222 from which a heated electrodeposition bath is circulatingly fed to the second electrodeposition tank, a first waste-solution tank 2172 in which the electrodeposition bath is temporarily stored before the electrodeposition bath of the first electrodeposition tank is discharged, a second waste-solution tank 2274 in which the electrodeposition bath is temporarily stored before the electrodeposition bath of the second electrodeposition tank is discharged, a filter circulation system for removing particles in the electrodeposition bath held in the first electrodeposition tank to make the bath clean (a piping system connected to a first electrodeposition tank filter circulation filter 2161), a filter circulation system for removing particles in the electrodeposition bath held in the second electrodeposition tank to make the bath clean (a piping system connected to a second electrodeposition tank filter circulation filter 2263), a piping system for sending bath-stirring compressed air to both the first electrodeposition tank and the second electrodeposition tank (a piping system extending from a compressed air feed inlet 2182), a pure-water shower tank 2360 in which the long substrate on which the electrodeposition film has been deposited is washed with a pure-water shower, a first hot-water tank (which here is called "hot water" since hot water is used for the pure water of a rinsing tank) 2361 in which first pure-water rinsing is carried out, a second hot-water tank 2362 in which second pure-water rinsing is carried out, a pure-water heating tank 2339 from which necessary hot pure-water is fed to these hot-water tanks, a drying section 2363 which dries the long substrate having a film formed thereon (film-deposited substrate) after it has been washed, a wind-up unit 2296 for winding again in a coil-like state the long substrate on which film deposition has been completed, and an exhaust system for discharging water vapor generated at the stage of heating the electrodeposition bath or pure water and at the stage of drying (an exhaust system constituted of an electrodeposition water washing system exhaust duct 2020 or a drying system exhaust duct 2370).

The long substrate is transported from the left to the right as viewed in the drawing, that is, in the order of the wind-off unit 2012, the first electrodeposition tank 2066, the second electrodeposition tank 2116, the pure-water shower tank 2360, the first hot-water tank 2361, the second hot-water tank 2362, the drying section 2363 and the wind-up unit 2296, so that a predetermined electrodeposition film is deposited.

As shown in FIG. 3, a long substrate 2006 wound on a long substrate bobbin 2001 in a coil-like state is set in the wind-off unit 2012, and the long substrate 2006 is wound off through a feed control roller 2003, a direction-changing roller 2004 and a delivery roller 2005 in this order. Especially when a subbing layer is previously deposited on the long substrate to be wound in a coil-like state, the substrate is supplied in the form where an interleaf (interleaving paper) has been rolled up together with the substrate so that the substrate or the previously formed layer can be protected. Accordingly, in the case where the interleaf has been rolled up, an interleaf 2007 is wound up on an interleaf wind-up bobbin 2002 while the long substrate is wound off. The direction in which the long substrate 2006 is transported is shown by an arrow 2010, the direction in which the long substrate bobbin 2001 is rotated is shown by an arrow 2009, and the direction in which the interleaf wind-up bobbin 2002 is wound up is shown by an arrow 2008. FIG. 3 shows that the long substrate delivered from the long substrate bobbin 2001 and the interleaf wound up on the interleaf wind-up bobbin 2002 are not interfered with each other at the transport-starting position and the transport-ending position. For the purpose of dust-proofing, the whole wind-off unit is so structured as to be covered with a wind-off unit clean booth 2011 making use of a HEPA (high-frequency particulate air) filter and a down flow.

The first electrodeposition tank 2066 comprises, as shown in FIG. 4, a first electrodeposition bath holder tank 2065 which is not corrosive against the electrodeposition bath and can keep the temperature of the electrodeposition bath, and in that tank a temperature-controlled electrodeposition bath is so held as to have a first electrodeposition bath surface 2025. The position of this bath surface is realized by an over flow attributable to a partition plate provided inside the first electrodeposition bath holder tank 2065. The partition plate (not shown) is so installed that the electrodeposition bath is let fall toward the inner-part side by the whole first electrodeposition bath holder tank 2065. The overflowed electrodeposition bath collected in tub structure in a first electrodeposition tank overflow return opening 2024 comes through a first electrodeposition tank overflow return path 2117 to the first circulation tank 2120 where the bath is heated and is circulated again into the first electrodeposition bath holder tank 2065 from a first electrodeposition tank upstream circulation jet pipe 2063 and a first electrodeposition tank downstream circulation jet pipe 2064 to form an inflow of the electrodeposition bath in a quantity enough for prompting the overflow.

The long substrate 2006 is passed through the inside of the first electrodeposition tank 2066 via an electrodeposition tank entrance turn-back roller 2013, a first electrodeposition tank approach roller 2014, a first electrodeposition tank withdrawal roller 2015 and an electrodeposition tank-to-tank turn-back roller 2016. Between the first electrodeposition tank approach roller 2014 and the first electrodeposition tank withdrawal roller 2015, at least "a film-forming surface" (often called "front surface" in the present specification) at the underside of the long substrate lies in the electrodeposition bath and faces twenty-eight anodes 2026 to 2053. In actual electrodeposition, negative potential is applied to the long substrate and positive potential is applied to the anodes, and electrodeposition electric current which causes electrochemical reaction concurrently is flowed across the both in the electrodeposition bath to effect electrodeposition.

In the apparatus as shown in FIG. 2, the anodes in the first electrodeposition tank are four by four placed on seven anode stands 2054 to 2060. The anode stands are so structured that the respective anodes are placed thereon through insulating plates, and are so made that individual potential is applied from independent power sources. Also, the anode stands 2054 to 2060 have the function to keep a distance between the long substrate and the anodes 2026 to 2053 in the electrodeposition bath. Accordingly, in usual cases, the anode stands 2054 to 2060 are so designed and produced that their height is adjustable to keep a predetermined distance between the them.

A first electrodeposition tank back surface electrode 2061 provided immediately before the first electrodeposition tank withdrawal roller 2015 is an electrode for electrochemically removing any film deposited unwantedly in the bath on "a surface of the long substrate opposite to a surface of the substrate on which a film is formed" (often called "back surface" in the present specification). This is materialized by bringing the first electrodeposition tank back surface electrode 2061 to negative potential with respect to the long substrate. Whether or not the first electrodeposition tank back surface electrode 2061 has its effect actually is confirmable by visually observing that a film of the same materials as the film formed on the film-forming surface of the long substrate is fast removed on and on, which adheres electrochemically to the back surface opposite to the film-forming surface of the long substrate, because of come-around of an electric field.

On the film-deposited long substrate having passed the first electrodeposition tank withdrawal roller 2015 and having come out of the electrodeposition bath, the electrodeposition bath is sprayed from a first electrodeposition tank exit shower 2067 to prevent the film-formed surface from drying to cause unevenness. Also, an electrodeposition tank-to-tank cover 2019 provided at a cross-over portion between the first electrodeposition tank 2066 and the second electrodeposition tank 2116 entraps the vapor generated from the electrodeposition bath, to prevent the film-formed surface of the long substrate from drying. Still also, a second electrodeposition tank entrance shower 2068 likewise acts to prevent it from drying.

The first circulation tank 2120 functions to heat the electrodeposition bath fed into the first electrodeposition tank 2066 to keep its temperature and jet-circulate it. As described previously, the electrodeposition bath having overflowed from the first electrodeposition tank 2066 is collected at the overflow return opening 2024, then passes the overflow return path 2117, and comes to a first circulation tank heating and holding tank 2121 via a first electrodeposition tank overflow return path insulating flange 2118.

Inside the first circulation tank heating and holding tank 2121, eight heaters 2122 to 2129 are provided, and are made to function when a room-temperature electrodeposition bath is initially heated or when the electrodeposition bath having come to have a low bath temperature as a result of circulation is again heated to keep the electrodeposition bath at a predetermined temperature.

Two circulation systems are connected to the first circulation tank heating and holding tank 2121. More specifically, they are a first electrodeposition tank upstream circulation flow-back system through which the electrodeposition bath returns from the first electrodeposition tank upstream circulation jet pipe 2063 to the first electrodeposition bath holder tank 2065 via an upstream circulation main valve 2130, an upstream circulation pump 2132, an upstream circulation valve 2135, an upstream circulation flexible pipe 2136 and an upstream circulation flange insulating pipe 2137, and a first electrodeposition tank downstream circulation flow-back system through which the electrodeposition bath returns from the first electrodeposition tank downstream circulation jet pipe 2064 to the first electrodeposition bath holder tank 2065 via a downstream circulation main valve 2139, a downstream circulation pump 2142, a downstream circulation valve 2145, a downstream circulation flexible pipe 2148 and a downstream circulation flange insulating pipe 2149. The electrodeposition bath which returns from the upstream circulation jet pipe 2063 and downstream circulation jet pipe 2064 to the first electrodeposition tank 2066 is circulated so that the electrodeposition bath can effectively be exchanged in the first electrodeposition bath holder tank 2065, and is circulated as jets from the upstream circulation jet pipe 2063 and downstream circulation jet pipe 2064 provided at a lower part of the first electrodeposition bath holder tank 2065, through orifices bored in their respective jet pipes. The amount of flowing back of each circulation flow-back system is chiefly controlled by the degree at which the upstream circulation valve 2135 or downstream circulation valve 2145 is opened or closed, and is more delicately controllable by an upstream circulation pump by-pass valve 2133 or a downstream circulation pump by-pass valve 2141, which is provided in a by-pass system connected by by-passing the upstream circulation pump 2132 or downstream circulation pump 2142 at its exit and entrance. Such by-pass systems also have the function to prevent any cavitation in the pumps when the electrodeposition bath is circulated in a small quantity or has a bath temperature very close to the boiling point. The cavitation which may make the bath solution boil to vaporize to make any liquid unfeedable may shorten the lifetime of pumps greatly.

When orifices are bored in the first electrodeposition tank upstream circulation jet pipe 2063 and first electrodeposition tank downstream circulation jet pipe 2064 to form jets, the amount of flowing back almost depends on the pressure of the solution returned to the upstream circulation jet pipe 2063 and downstream circulation jet pipe 2064. To know this pressure, a first electrodeposition tank electrodeposition bath upstream circulation pressure gauge 2134 and a first electrodeposition tank electrodeposition bath downstream circulation pressure gauge 2143 are provided so that the balance of the amount of flowing back can be known by these pressure gauges. Stated accurately, the quantity of flowed-back bath solution jetted from the orifices follows the Bernouilli theorem. When, however, the orifices bored in the jet pipes are several millimeters or less in diameter, the jet quantity can be made substantially constant over the whole first electrodeposition tank upstream circulation jet pipe 2063 or first electrodeposition tank downstream circulation jet pipe 2064. When also the amount of flowing back is sufficiently large, the bath can be exchanged very smoothly. Hence, even when the first electrodeposition tank 2066 is fairly long, making bath concentration uniform and making temperature uniform can effectively be achieved. As a matter of course, the first electrodeposition tank overflow return path 2117 should have a diameter large enough for the bath to be flowed back in a sufficient quantity.

The upstream circulation flexible pipe 2136 and the downstream circulation flexible pipe 2148, which are provided in the respective circulation flow-back systems, absorb any strain of piping systems, and are effective especially when flange insulating piping which tends to have an insufficient mechanical strength is used. The upstream circulation flange insulating pipe 2137 and the downstream circulation flange insulating pipe 2149, which are provided in the respective circulation flow-back systems, make the first circulation tank 2120 and first electrodeposition tank 2066 electrically float together with the first electrodeposition tank overflow return path insulating flange 2118, provided in the course of the first electrodeposition tank overflow return path 2117. This is based on the present inventor's findings that the breaking off of formation of unnecessary electric-current paths, i.e., the prevention of stray electric current leads to stable and effective procedure of the electrochemical film-forming reaction that utilizes electrodeposition electric current.

The other circulation flow-back system is provided with a by-pass flow-back system which returns directly to the first circulation tank heating and holding tank 2121 and comprises a by-pass circulation flexible pipe 2146 and a by-pass circulation valve 2147. This is used when the bath should be circulated without circulating the bath solution to the first electrodeposition tank, e.g., when the bath temperature is raised from room temperature to a predetermined temperature. The other circulation flow-back system extending from the first circulation tank is also provided with a solution feed system in which the long substrate passes the first electrodeposition tank withdrawal roller 2015 from the electrodeposition bath and is sprayed with the electrodeposition bath by the first electrodeposition tank exit shower 2067. It extends to the first electrodeposition tank exit shower 2067 via a first electrodeposition tank exit shower valve 2150. The amount of the electrodeposition solution sprayed from the exit shower 2067 is regulated by controlling the degree of opening or closing the exit shower valve 2150.

The first circulation tank heating and holding tank 2121 is actually provided with a cover to provide a structure that can prevent the bath from vaporizing to lose water. When the bath has a high temperature, the cover also comes to have a high temperature, and hence it should be taken into consideration to, e.g., attach a heat insulation material. This is necessary in view of the safety of operation.

In order to remove particles floating in the first electrodeposition tank electrodeposition bath, a filter circulation system is provided. A filter circulation system for the first electrodeposition tank consists of a filter circulation return flexible pipe 2151, a filter circulation return flange insulating pipe 2152, a filter circulation main valve 2154, a filter circulation suction filter 2156, a filter circulation pump 2157, a filter circulation pump by-pass valve 2158, a filter circulation pressure switch 2159, a filter circulation pressure gauge 2160, a filter circulation filter 2161, a filter circulation flexible pipe 2164, a filter circulation flange insulating pipe 2165, a filter circulation valve 2166, a filter circulation system electrodeposition bath upstream return valve 2167, a filter circulation system electrodeposition bath midstream return valve 2168 and a filter circulation system electrodeposition bath downstream return valve 2168. Through this course, the electrodeposition bath flows in the direction of first electrodeposition tank filter circulation directions 2155, 2162 and 2163. The particles to be removed may originate from powder brought in from the outside of the system or may be formed on the electrode surface or in the bath, depending on electrodeposition reaction. Minimum size of the particles to be removed depends on the filter size of the filter circulation filter 2161.

The filter circulation return flexible pipe 2151 and the filter circulation flexible pipe 2164 are pipes for absorbing any strain of piping systems to minimize any liquid leakage from pipe-connected portions and also protect the insulating pipe inferior in mechanical strength so that the constituent parts of the circulation system which includes pumps can be disposed at a greater degree of freedom. The filter circulation return flange insulating pipe 2152 and the filter circulation flange insulating pipe 2165 are provided so that the first electrodeposition bath holder tank 2065 set floating from the ground earth can be made to float electrically to prevent it from falling to the ground earth. The filter circulation suction filter 2156 is a wire cloth like a "tea strainer", so to speak, and is a filter for removing large foreign matters so as to protect the subsequent filter circulation pump 2157 and filter circulation filter 2161. The filter circulation filter 2161 is the leading part of this circulation system, and is a filter for removing any particles having mixed or occurred in the electrodeposition bath. Circulation flow rate of the electrodeposition bath in this circulation system is micro-adjusted primarily by the filter circulation valve 2166, and secondarily by the filter circulation pump by-pass valve 2158, provided in parallel to the filter circulation pump 2157. The filter circulation pressure gauge 2160 is provided in order to catch the circulation flow rate to be adjusted by these valves. The filter circulation pump by-pass valve 2158 not only micro-adjusts the flow rate but also prevents the filter circulation pump 2157 from breaking because of any cavitation which may occur when the whole filter circulation flow rate is reduced.

The electrodeposition bath can be transferred to a first waste-solution tank 2172 through the filter circulation return flange insulating pipe 2152 via a first electrodeposition tank drain valve 2153. This transfer is made when the electrodeposition bath is replaced, when the apparatus is put to maintenance work and also on occasion of emergency. The electrodeposition bath as a waste solution to be transferred is fallen by gravity-drop into a first waste-solution tank waste-solution holder tank 2144. For the purpose of maintenance work or emergency measures, the first waste-solution tank waste-solution holder tank 2144 may preferably have a capacity large enough to store the total bath volume of the first electrodeposition tank 2066 and the first circulation tank 2120. The first waste-solution tank waste-solution holder tank 2144 is provided with a top cover 2277 and, in order to make the gravity-drop transfer of the electrodeposition bath effective, it is provided with an air vent 2172 and a first waste-solution tank air vent valve 2170. The electrodeposition bath which has temporarily been fallen into the first waste-solution tank waste-solution holder tank 2144 is, after its temperature has lowered, sent out through a waste-solution drainage valve 2173 for drainage treatment on the side of a building, or collected in a steel drum (not shown) through a waste-solution collection valve 2174, a waste-solution collection main valve 2175, a waste-solution collection main suction filter 2176 and a waste-solution collection pump 2177 so as to be put to appropriate disposal. Before the collection or treatment, the waste solution may also be diluted with water or treated with chemicals in the waste-solution holder tank 2144.

In order to stir the electrodeposition bath to make uniform formation of the electrodeposition film, the system is so designed that air bubbles are jetted from a plurality of orifices bored in a first electrodeposition tank stirring air feed pipe 2062 installed at the bottom of the first electrodeposition bath holder tank 2065. As air, compressed air fed to a factory is taken in from a compressed-air intake opening 2182 and, through an electrodeposition bath stirring compressed-air pressure switch 2183 and in the direction shown by a compressed-air feed direction 2184, the compressed air is passed through a compressed-air main valve 2185, a compressed-air flow meter 2186, a compressed-air regulator 2187, a compressed-air mist separator 2188, a compressed-air feed valve 2189, a compressed-air flexible pipe 2190, a compressed-air insulating pipe 2191 and a compressed-air upstream-side control valve 2193 or a compressed-air downstream-side control valve 2192 in this order, and is led to the first electrodeposition tank stirring air feed pipe 2062.

The film-deposited long substrate transported to the second electrodeposition tank 2116 through the electrodeposition tank-to-tank turn-back roller 2016 is subjected to deposition of a second electrodeposited film or to some treatment. Depending on the manner of use of the present apparatus, the second electrodeposited film may be the same as the first electrodeposited film, and the first and second electrodeposited films may make up one film. Alternatively, the two layers may make up a stacked layer of two layers formed of the same material but endowed with different properties (e.g., stacked layers each formed of zinc oxide having the same particle size but one layer being different in particle size from the other layer), or a stacked layer of two layers having the same properties but formed of different materials (e.g., stacked layers composed of an indium oxide layer and a zinc oxide layer as transparent conductive layers), or a stacked layer of entirely different layers. Still alternatively, a low oxide may be deposited in the first electrodeposition tank 2066 and its oxidation-promoting treatment may be made in the second electrodeposition tank 2116, or a low oxide may be deposited in the first electrodeposition tank 2066 and its etching treatment may be made in the second electrodeposition tank 2116. Such combinations are possible. Accordingly, electrodeposition or treatment conditions such as electrodeposition bath or treatment bath, bath temperature, bath circulation quantity, electric-current density and stirring rate may be selected according to the corresponding purposes.

When electrodeposition or treatment time must be made different between the first electrodeposition tank 2066 and the second electrodeposition tank 2116, the time for which the long substrate 2006 is passed may be made different between the first electrodeposition tank 2066 and the second electrodeposition tank 2116. To make such time different, it may be regulated by making tank length different between the first electrodeposition tank 2066 and the second electrodeposition tank 2116, or by making the long substrate turn back.

The second electrodeposition tank 2116 comprises, as shown in FIG. 5, a second electrodeposition bath holder tank 2115 which is not corrosive against the electrodeposition bath and can keep the temperature of the electrodeposition bath, and in that tank a temperature-controlled electrodeposition bath is so held as to have a second electrodeposition bath surface 2074. The position of this bath surface is realized by an over flow attributable to a partition plate provided inside the second electrodeposition bath holder tank 2115. The partition plate (not shown) is so installed that the electrodeposition bath is let fall toward the inner-part side by the whole second electrodeposition bath holder tank 2115. The overflowed electrodeposition bath collected in tub structure in a second electrodeposition tank overflow return opening 2075 comes through a second electrodeposition tank overflow return path 2219 to the second circulation tank 2222 where the bath is heated and is circulated again into the second electrodeposition bath holder tank 2115 from a second electrodeposition tank upstream circulation jet pipe 2113 and a second electrodeposition tank downstream circulation jet pipe 2114 to form an inflow of the electrodeposition bath in a quantity enough for prompting the overflow.

The film-deposited long substrate 2006 is passed through the inside of the second electrodeposition tank 2116 via the electrodeposition tank-to-tank turn-back roller 2016, a second electrodeposition tank approach roller 2069, a second electrodeposition tank withdrawal roller 2070 and a pure-water shower tank turn-back approach roller 2279. Between the second electrodeposition tank approach roller 2069 and the second electrodeposition tank withdrawal roller 2070, the front surface of the long substrate lies in the electrodeposition bath and faces twenty-eight anodes 2076 to 2103. In actual electrodeposition, negative potential is applied to the long substrate and positive potential to the anodes, and electrodeposition electric current which causes electrochemical reaction concurrently is flowed across the both in the electrodeposition bath to effect electrodeposition.

In the apparatus as shown in FIG. 2, the anodes in the second electrodeposition tank are four by four placed on seven anode stands 2104 to 2110. The anode stands are so structured that the respective anodes are placed thereon through insulating plates, and are so made that individual potential is applied from independent power sources. Also, the anode stands 2104 to 2110 have the function to keep a distance between the long substrate and the anodes 2076 to 2103 in the electrodeposition bath. Accordingly, in usual cases, the anode stands 2104 to 2110 are so designed and produced that their height is adjustable to keep a predetermined distance between them.

A second electrodeposition tank back surface electrode 2111 provided immediately before the second electrodeposition tank withdrawal roller 2070 is an electrode for electrochemically removing any film deposited unwantedly in the bath on the back side of the long substrate. This is materialized by making the second electrodeposition tank back surface electrode 2111 a negative potential with respect to the long substrate.

On the film-deposited long substrate having passed the second electrodeposition tank withdrawal roller 2070 and having come out of the electrodeposition bath, the electrodeposition bath is sprayed from a second electrodeposition tank exit shower 2297 to prevent the film-formed surface from drying to cause unevenness. Also, a pure-water shower tank turn-back approach roller cover 2318 provided at a cross-over portion between the second electrodeposition tank 2116 and a pure-water shower tank 2360 entraps the vapor generated from the electrodeposition bath, thereby preventing the film-formed surface of the long substrate from drying. Still also, a pure-water shower tank entrance front-surface pure-water shower 2299 and a pure-water shower tank entrance back-surface pure-water shower 2300 not only wash off the electrodeposition bath but also function likewise.

The second circulation tank 2222 functions to heat the electrodeposition bath fed into the second electrodeposition tank 2116 to keep its temperature and jet-circulate it. As described previously, the electrodeposition bath having overflowed from the second electrodeposition tank 2116 is collected at the overflow return opening 2075, then passes the overflow return path 2219, and comes to a second circulation tank heating and holding tank 2223 via a second electrodeposition tank overflow return path insulating flange 2220. Inside the second circulation tank heating and holding tank 2223, eight heaters 2224 to 2231 are provided, and are made to function when a room-temperature electrodeposition bath is initially heated or when the electrodeposition bath having come to have a low bath temperature as a result of circulation is again heated to keep the electrodeposition bath at a predetermined temperature.

Two circulation systems are connected to the second circulation tank heating and holding tank 2223. More specifically, they are a second electrodeposition tank upstream circulation flow-back system in which the electrodeposition bath returns from the second electrodeposition tank upstream circulation jet pipe 2113 to the second electrodeposition bath holder tank 2115 via an upstream circulation main valve 2232, an upstream circulation pump 2234, an upstream circulation valve 2237, an upstream circulation flexible pipe 2238 and an upstream circulation flange insulating pipe 2239, and a second electrodeposition tank downstream circulation flow-back system in which the electrodeposition bath returns from the second electrodeposition tank downstream circulation jet pipe 2114 to the second electrodeposition bath holder tank 2115 via a downstream circulation main valve 2242, a downstream circulation pump 2245, a downstream circulation valve 2247, a downstream circulation flexible pipe 2248 and a downstream circulation flange insulating pipe 2249. The electrodeposition bath which returns from the upstream circulation jet pipe 2113 and downstream circulation jet pipe 2114 to the second electrodeposition tank 2116 is circulated so that the electrodeposition bath can effectively be exchanged in the second electrodeposition bath holder tank 2115, and is circulated as jets from the upstream circulation jet pipe 2113 and downstream circulation jet pipe 2114 provided at a lower part of the second electrodeposition bath holder tank 2115, through orifices bored in their respective jet pipes. The amount of flowing back of each circulation flow-back system is chiefly controlled by the degree at which the upstream circulation valve 2237 or downstream circulation valve 2247 is opened or closed, and is more delicately controllable by an upstream circulation pump by-pass valve 2235 or a downstream circulation pump by-pass valve 2244, which is provided in a by-pass system connected by by-passing the upstream circulation pump 2234 or downstream circulation pump 2245 at its exit and entrance. Such by-pass systems also have the function to prevent any cavitation in the pumps when the electrodeposition bath is circulated in a small quantity or has a bath temperature very close to the boiling point. The cavitation which, as also stated in the description of the first electrodeposition tank 2066, causes the boiling and vaporization of the bath solution to make any liquid unfeedable may shorten the lifetime of pumps greatly.

When orifices are bored in the second electrodeposition tank upstream circulation jet pipe 2113 and second electrodeposition tank downstream circulation jet pipe 2114 to form jets, the amount of flowing back almost depends on the pressure of the solution returned to the upstream circulation jet pipe 2113 and downstream circulation jet pipe 2114. To know this pressure, a second electrodeposition tank electrodeposition bath upstream circulation pressure gauge 2236 and a second electrodeposition tank electrodeposition bath downstream circulation pressure gauge 2246 are provided so that the balance of the amount of flowing back can be known by these pressure gauges. Stated accurately, the quantity of flowed-back bath solution jetted from the orifices follows the Bernouilli theorem. When, however, the orifices bored in the jet pipes are several millimeters or less in diameter, the jet quantity can be made substantially constant over the whole second electrodeposition tank upstream circulation jet pipe 2113 or second electrodeposition tank downstream circulation jet pipe 2114. When also the amount of flowing back is sufficiently large, the bath can be exchanged very smoothly. Hence, even when the second electrodeposition tank 2116 is fairly long, making bath concentration uniform and making temperature uniform can effectively be achieved. As a matter of course, the second electrodeposition tank overflow return path 2219 should have a large diameter enough for the bath to be flowed back in a sufficient quantity.

The upstream circulation flexible pipe 2238 and the downstream circulation flexible pipe 2248, which are provided in the respective circulation flow-back systems, absorb any strain of piping systems, and are effective especially when flange insulating piping which tends to have an insufficient mechanical strength is used. The upstream circulation flange insulating pipe 2239 and the downstream circulation flange insulating pipe 2249, which are provided in the respective circulation flow-back systems, make the second circulation tank 2222 and second electrodeposition tank 2116 electrically float together with the second electrodeposition tank overflow return path insulating flange 2220, provided in the course of the second electrodeposition tank overflow return path 2219. This is based on the present inventors' findings that the breaking off of formation of unnecessary electric-current paths, i.e., the prevention of stray electric current leads to stable and effective procedure of the electrochemical film-forming reaction that utilizes electrodeposition electric current.

The other circulation flow-back system is provided with a by-pass flow-back system which returns directly to the second circulation tank heating and holding tank 2223 and comprises a by-pass circulation flexible pipe 2250 and a by-pass circulation valve 2251. This is used when the bath should be circulated without circulating the bath solution to the second electrodeposition tank, e.g., when the bath temperature is raised from room temperature to a predetermined temperature. Both the circulation flow-back systems extending from the second circulation tank are also provided with two solution feed systems, one solution feed system sending the electrodeposition bath to a second electrodeposition tank entrance shower 2068 which sprays the bath on the film-deposited long substrate immediately before it reaches the second electrodeposition tank approach roller 2069, and the other solution feed system sending the electrodeposition bath to a second electrodeposition tank exit shower 2297 which sprays the bath on the film-deposited long substrate having passed the second electrodeposition tank withdrawal roller 2070 to have come out of the electrodeposition bath. The former extends to the second electrodeposition tank entrance shower 2068 via a second electrodeposition tank entrance shower valve 2241, and the latter extends to the second electrodeposition tank exit shower 2297 via a second electrodeposition tank exit shower valve 2252. The amount of the electrodeposition solution sprayed from the entrance shower 2068 is regulated by controlling the degree of opening or closing the entrance shower valve 2241, and the amount of the electrodeposition solution sprayed from the exit shower 2297 is regulated by controlling the degree of opening or closing the exit shower valve 2252.

The second circulation tank heating and holding tank 2223 is actually provided with a cover to provide a structure that can prevent the bath from vaporizing to lose water. When the bath has a high temperature, the cover also comes to have a high temperature, and hence it should be taken into consideration to, e.g., attach a heat insulation material. This is necessary in view of the safety of operation.

In order to remove particles floating in the second electrodeposition tank electrodeposition bath, a filter circulation system is provided. A filter circulation system for the second electrodeposition tank consists of a filter circulation return flexible pipe 2253, a filter circulation return flange insulating pipe 2254, a filter circulation main valve 2256, a filter circulation suction filter 2258, a filter circulation pump 2260, a filter circulation pump by-pass valve 2259, a filter circulation pressure switch 2261, a filter circulation pressure gauge 2262, a filter circulation filter 2263, a filter circulation flexible pipe 2266, a filter circulation flange insulating pipe 2267, a filter circulation valve 2268, a filter circulation system electrodeposition bath upstream return valve 2269, a filter circulation system electrodeposition bath midstream return valve 2270 and a filter circulation system electrodeposition bath downstream return valve 2271. Through this course, the electrodeposition bath flows in the direction of second electrodeposition tank filter circulation directions 2257, 2264 and 2265. The particles to be removed may originate from powder brought in from the outside of the system or may be formed on the electrode surface or in the bath, depending on electrodeposition reaction. Minimum size of the particles to be removed depends on the filter size of the filter circulation filter 2263.

The filter circulation return flexible pipe 2253 and the filter circulation flexible pipe 2266 are pipes for absorbing any strain of piping systems to minimize any liquid leakage from pipe-connected portions and also protect the insulating pipe inferior in mechanical strength so that the constituent parts of the circulation system which includes pumps can be disposed at a greater degree of freedom. The filter circulation return flange insulating pipe 2254 and the filter circulation flange insulating pipe 2267 are provided so that the second electrodeposition bath holder tank 2115 set floating from the ground earth can be made to float electrically to prevent it from falling to the ground earth. The filter circulation suction filter 2258 is a wire cloth like a "tea strainer", so to speak, and is a filter for removing large foreign matters so as to protect the subsequent filter circulation pump 2260 and filter circulation filter 2263. The filter circulation filter 2263 is the leading part of this circulation system, and is a filter for removing any particles having mixed or occurred in the electrodeposition bath. Circulation flow rate of the electrodeposition bath in this circulation system is micro-adjusted primarily by the filter circulation valve 2268, and secondarily by the filter circulation pump by-pass valve 2259, provided in parallel to the filter circulation pump 2260. The filter circulation pressure gauge 2262 is provided in order to catch the circulation flow rate to be adjusted by these valves. The filter circulation pump by-pass valve 2259 not only micro-adjusts the flow rate but also prevents the filter circulation pump 2260 from breaking because of any cavitation which may occur when the whole filter circulation flow rate is reduced.

The electrodeposition bath can be transferred to a second waste-solution tank 2274 through the filter circulation return flange insulating pipe 2254 via a second electrodeposition tank drain valve 2255. This transfer is made when the electrodeposition bath is replaced, when the apparatus is put to maintenance work and also on occasion of emergency. The electrodeposition bath as a waste solution to be transferred is fallen by gravity-drop into a second waste-solution tank waste-solution holder tank 2273. For the purpose of maintenance work or emergency measures, the second waste-solution tank waste-solution holder tank 2273 may preferably have a large capacity enough to store the total bath volume of the second electrodeposition tank 2116 and the second circulation tank 2222. The second waste-solution tank waste-solution holder tank 2273 is provided with a top cover 2278 and, in order to make the gravity-drop transfer of the electrodeposition bath effective, it is provided with an air vent 2276 and a second waste-solution tank air vent valve 2275. The electrodeposition bath which has temporarily been fallen into the second waste-solution tank waste-solution holder tank 2273 is, after its temperature has lowered, sent out through a waste-solution drainage valve 2180 for drainage treatment on the side of a building, or collected in a steel drum (not shown) through a waste-solution collection valve 2181, a waste-solution collection main valve 2175, a waste-solution collection main suction filter 2176 and a waste-solution collection pump 2177 so as to be put to appropriate disposal. Before the collection or treatment, the waste solution may also be diluted with water or treated with chemicals in the waste-solution holder tank 2273.

In order to stir the electrodeposition bath to make uniform formation of the electrodeposition film, the system is so designed that air bubbles are jetted from a plurality of orifices bored in a second electrodeposition tank stirring air feed pipe 2112 installed at the bottom of the second electrodeposition bath holder tank 2115. As air, compressed air fed to a factory is taken in from a compressed-air intake opening 2182 and is passes through an electrodeposition bath stirring compressed-air pressure switch 2183, and in the direction shown by a compressed-air feed direction 2194, the compressed air is passed through a compressed-air main valve 2195, a compressed-air flow meter 2196, a compressed-air regulator 2197, a compressed-air mist separator 2198, a compressed-air feed valve 2199, a compressed-air flexible pipe 2220, a compressed-air insulating pipe 2201 and a compressed-air upstream-side control valve 2202 or a compressed-air downstream-side control valve 2272 in this order, and is led to the second electrodeposition tank stirring air feed pipe 2112.

In the first electrodeposition tank 2066 and second electrodeposition tank 2116, a preliminary feed system is installed so that a preliminary liquid or gas can be fed in. Liquid or gas having entered from an electrodeposition tank preliminary feed inlet 2213 is fed via an electrodeposition tank preliminary feed valve 2214, into the first electrodeposition tank through a first electrodeposition tank preliminary feed valve 2215 and a first electrodeposition tank preliminary feed insulating pipe 2216, and also into the second electrodeposition tank through a second electrodeposition tank preliminary feed valve 2217 and a second electrodeposition tank preliminary feed insulating pipe 2218. In the preliminary feed system, those having the highest possibility of being fed in are retaining agents or replenishing chemicals which are used for keeping the ability of the bath constant for a long time. In some cases, they may be gases to be dissolved in the bath or acids capable of removing the particles.

The rinsing is carried out through three stages of a pure-water shower tank, a first hot-water tank and a second hot-water tank. Its system is so constructed that heated pure water is fed to the second hot-water tank, and its waste solution is used in the first hot-water tank, and further its waste solution is used in the pure-water shower tank. Thus, after the electrodeposition in the electrodeposition tanks has been completed, the film-deposited long substrate is washed on with water having purities stepwise made higher.

Pure water having the highest purity is used in the second hot-water tank. This pure water is fed to a second hot-water tank exit back-surface pure-water shower 2309 and a second hot-water tank exit front-surface pure-water shower 2310. The pure water to be fed is temporarily stored in a pure-water heating tank 2339 from a water washing system pure-water inlet 2337 through a water washing system pure-water feed main valve 2338, then heated to a predetermined temperature by means of pure-water heaters 2340 to 2343, and then passed through a pure-water delivery valve 2344, a pure-water delivery pump 2346, a tank pressure switch 2347, a cartridge type filter 2349 and a flow meter 2350. Then the pure water is on the one hand led through a second hot-water tank exit back-surface shower valve 2351 to the second hot-water tank exit back-surface pure-water shower 2309 and on the other hand led through a second hot-water tank exit front-surface shower valve 2352 to the second hot-water tank exit front-surface pure-water shower 2310. The heating is in order to improve cleaning effect. The pure water fed to the showers and collected in a second hot-water tank hot-water holding tank 2317 forms a pure-water rinsing bath, and the film-deposited long substrate is washed with still water. In the second hot-water tank, a hot-water warming heater 2307 is provided so that the temperature of the pure water does not drop.

To the first hot-water tank 2361, pure water having overflowed the second hot-water tank hot-water holding tank 2317 is fed from the second hot-water tank 2362 via a hot-water tank-to-tank connecting pipe 2322. To the first hot-water tank 2361, like the second hot-water tank 2362, a first hot-water tank hot-water warming heater 2304 is provided so that the temperature of the pure water can be maintained. To the first hot-water tank 2361, an ultrasonic wave source 2306 is further provided so that any stains on the film-deposited long substrate surface can positively removed between a first hot-water tank roller 2282 and a second hot-water tank turn-back approach roller 2283.

The pure water from a first hot-water tank hot-water holding tank 2316 is sent through a pure-water shower feed main valve 2323, a pure-water shower feed pump 2325, a pure-water shower feed pressure switch 2326, a pure-water shower feed cartridge type filter 2328 and a pure-water shower feed flow meter 2329, and is further sent from a pure-water shower tank entrance front-surface pure-water shower valve 2330 to a pure-water shower tank entrance front-surface pure-water shower 2299, from a pure-water shower tank entrance back-surface pure-water shower valve 2331 to a pure-water shower tank entrance back-surface pure-water shower 2300, from a pure-water shower tank exit back-surface pure-water shower valve 2332 to a pure-water shower tank exit back-surface pure-water shower 2302, and from a pure-water shower tank exit front-surface pure-water shower valve 2333 to a pure-water shower tank exit front-surface pure-water shower 2303, whereby washing shower streams are applied to the front surface and back surface of the film-deposited long substrate at the entrance and exit of the pure-water shower tank 2360. The water having been served on showering is received in a pure-water shower tank receiving tank 2315, and, as it is, joined with a part of the water in the first hot-water tank hot-water holding tank 2316 and second hot-water tank hot-water holding tank 2317, which is then discarded to a water washing system drainage 2336. Usually, the water having been served on washing contains ions and others, and must be subjected to predetermined treatment.

In the pure-water shower tank 2360, first hot-water tank 2361 and second hot-water tank 2362, the film-deposited long substrate is forwarded to a pure-water shower tank return-back approach roller 2279, a pure-water shower tank roller 2280, a first hot-water tank return-back approach roller 2281, a first hot-water tank roller 2282, a second hot-water tank return-back approach roller 2283, a second hot-water tank roller 2284 and a drying-section return-back roller 2285. Immediately at the rear of the pure-water shower tank return-back approach roller 2279, a pure-water shower tank back-surface brush 2298 is provided so that any relatively large particles or weakly adherent products having adhered to the back surface of the film-deposited long substrate can be removed.

The film-deposited long substrate 2006 having come to the drying section 2363 is first hydro-extracted with a drying-section entrance back-surface air knife 2311 and a drying-section entrance front-surface air knife 2312. To the air-knives, air is fed through the course consisting of a drying-system compressed-air feed inlet 2353, a drying-system compressed-air pressure switch 2354, a drying-system compressed-air filter regulator 2355, a drying-system compressed-air mist separator 2356, a drying-system compressed-air feed valve 2357 and then a drying-section entrance back-surface air knife valve 2358 or a drying-section entrance front-surface air knife valve 2359. The air fed to the drying section may cause a difficulty especially if it contains water drops or the like. Accordingly, the role of the drying-system compressed-air mist separator 2356 is important.

In the course where the film-deposited long substrate is transported from the drying-section return-back roller 2285 to a wind-up unit approach roller 2286, the substrate is dried by radiation heat of IR lamps arranged there. As long as the IR lamps provide sufficient radiation heat, no difficulty may occur even when the long substrate 2006 is put into a vacuum apparatus such as a CVD apparatus after the electrodeposition film has been formed thereon. At the time of drying, the hydro-extraction causes fog and the IR lamp radiation causes water vapor. Accordingly, it is indispensable to provide a drying-section exhaust vent 2314 communicating with an exhaust duct. The water vapor collected in a drying-system exhaust duct 2370 is almost all returned to water in a drying-system condenser 2371, which is then discarded to a drying-system condenser water drainage 2373 and is partly discarded to drying-system exhaust 2374. When the water vapor contains any harmful gases, it should be driven off after a predetermined treatment.

In the wind-up unit 2296, the film-deposited long substrate 2006 is brought to pass an approach roller 2286, a direction change roller 2287, a wind-up regulation roller 2288 in this order, and is successively wound up in a coil-like state on a film-deposited long substrate wind-up bobbin 2289. When it is necessary to protect the deposited film, an interleaf is wound off from an interleaf wind-off bobbin 2290 and is rolled up together with the film-deposited long substrate. The direction in which the film-deposited long substrate 2006 is transported is shown by an arrow 2292, the direction in which the film-deposited long substrate wind-up bobbin 2289 is rotated is shown by an arrow 2293, and the direction in which the interleaf wind-off bobbin 2290 is wound up is shown by an arrow 2294. FIG. 7 shows that the film-deposited long substrate wound up on the wind-up bobbin 2289 and the interleaf wound off from the interleaf wind-off bobbin 2290 are not interfered with each other at the transport-starting position and the transport-ending position. For the purpose of dust-proofing, the whole wind-up unit is so structured as to be covered with a clean booth 2295 making use of a HEPA filter and a down flow.

In the wind-up unit as shown in FIG. 7, the direction change roller 2287 is provided with the function to correct any meandering of the long substrate. In accordance with signals from a meander detector provided between the direction change roller 2287 and the wind-up regulation roller 2288, the direction change roller 2287 is made to swing by a hydraulic servo around a shaft set on the side of the approach roller 2286, whereby any meandering motion can be corrected. The direction change roller 2287 is controlled by the movement of the roller approximately toward the front side or the back side of FIG. 7, and the direction of its movement is opposite to the direction of detection of the meandering of the long substrate from the meander detector. Gain of the servo depends on the long substrate transport speed, and is commonly not required to be large. Even when a long substrate of hundreds of meters in length is wound up, its edge faces can be made even at a precision on a submillimetric order.

Use of the electrodeposition bath and hot water at a temperature higher than room temperature generates water vapor necessarily. In particular, their use at a temperature higher than 80° C. generates water vapor considerably. Water vapor generated from the bath surface in the tank may gather on the bath surface in the tank to come to spout strongly from gaps of the apparatus or to become released in a large quantity when the cover is opened, or it may flow down in water drops from gaps of the apparatus, to worsen operational environment of the apparatus. Accordingly, the water vapor may preferably be discharged forcedly by suction. Water vapor is collected to the exhaust duct 2020 via an upstream exhaust vent 2021, a midstream exhaust vent 2022 and a downstream exhaust vent 2023 of the first electrodeposition tank 2066 and also an upstream exhaust vent 2071, a midstream exhaust vent 2072 and a downstream exhaust vent 2073 of the second electrodeposition tank 2116, an exhaust vent 2301 of the pure-water shower tank 2360, an exhaust vent 2305 of the first hot-water tank 2361 and an exhaust vent 2308 of the second hot-water tank 2362, and is passed through insulating flanges (2364, 2365) and almost all returned to water through an electrodeposition water washing system exhaust duct condenser 2366, which is then discarded to a condenser water drainage 2368 and is partly discarded to electrodeposition water washing system exhaust 2369. When the water vapor contains any harmful gases, it should be subjected to a predetermined treatment.

In the apparatus as shown in FIG. 2, the exhaust duct is constituted of stainless steel. Accordingly, in order to bring the bath holder tank 2065 of the first electrodeposition tank 2066 and the bath holder tank 2115 of the second electrodeposition tank 2116 from the ground earth to the float potential, an electrodeposition water washing system exhaust duct key insulating flange 2365 and an electrodeposition water washing system exhaust duct water-washing-side insulating flange 2364 are provided so that the both tanks are electrically separated.

When carrying out formation of a zinc oxide film by the electrodeposition apparatus as shown in FIG. 2 (FIGS. 3 to 9), however, the following disadvantage was found. Into this electrodeposition apparatus, a filtration-circulation system using a filtration apparatus such as a filter can be incorporated, and the dust and powder (particles) produced with the progress of electrodeposition process are mostly collected in this filtration apparatus; therefore, the zinc oxide thin film formed by electrodeposition is not affected by such dust and powder. In fact, the electrodeposition bath was transparent during the operation of the electrodeposition apparatus made by the present inventors and there were no particles, bump projections, dents and scratches caused on the electrodeposited zinc oxide.

According to the investigation of the present inventors, the electrodeposition bath itself has a long service life, for example, it stands one-month continuous use. However, during one-month use, the apparatus must be laid idle on holidays and when it needs maintenance and repair, causing a decrease in electrodeposition bath temperature. In the electrodeposition bath, if once it starts to be used, a large amount of sediment of white zinc oxide particles, which is attributed to a change in solubility due to a change in temperature, is observed during its temperature decreasing process. Or if the circulation or stirring of the bath is stopped and the bath is laid stagnant, the production of zinc oxide particles may sometimes be observed, though the amount is not so large as in the above case.

These types of zinc oxide particles are hard to be produced when the concentration of the solution is low; however, the concentration of the solution cannot be changed largely because the surface geometry of a zinc oxide thin film to be formed must be controlled. The diameter of the particles even reaches several mm (attributed to secondary aggregation), and when continuing to form a zinc oxide thin film by the electrodeposition process, the particles are stirred up due to the circulation of the electrodeposition bath and then deposited on the surfaces of the substrate and the zinc oxide film already formed, thereby resulting in occurrence of what are called defects, from the microscopic viewpoint, such as abnormal bump projection, film chipping and film cracks. At the same time, it is unavoidable to cause a sequence of decrease in electrodeposition bath temperature to occur when operating the apparatus.

SUMMARY OF THE INVENTION

In view of the above problem, the object of the present invention is to provide a process for electrodepositing a zinc oxide film on a substrate which can prevent the generated zinc oxide particles from attaching on the surfaces of the substrate and the zinc oxide film already formed by the electrodeposition when restarting or starting the formation of a zinc oxide thin film by the electrodeposition process using an electrodeposition apparatus, and hence the formation of a uniform zinc oxide film free from defects.

In order to overcome the above problem, the present invention provides a process for electrodepositing a zinc oxide film, comprising immersing a substrate and an opposing electrode in an electrodeposition bath which contains zinc nitrate and is kept heated, and passing a current between the substrate and the opposing electrode, wherein the process further includes a step of trapping the particles of zinc oxide precipitated in the bath by circulating or stirring the electrodeposition bath before the formation of the zinc oxide film.

In the above process for electrodepositing a zinc oxide film, preferably the circulation or stirring of the electrodeposition bath is carried out by causing jets or air-bubbling in the electrodeposition bath.

In the step of trapping the particles of zinc oxide, preferably the number of the particles having a diameter of 1 $\mu$m or more in the electrodeposition bath is decreased to 30 million counts per ml or less.

Preferably a long substrate is used as the above substrate.

Preferably a roll-to-roll system is adopted in which the long substrate is transported between rolls in a state where the substrate is wound off from the substrate wound in one roll and is wound up in another roll.

Preferably the process for electrodepositing a zinc oxide film includes a step of increasing the temperature of the above electrodeposition bath after starting the step of trapping the zinc oxide particles.

Further the present invention provides a process for electrodepositing a zinc oxide film, which comprises: a first step of immersing a substrate and an opposing electrode in an electrodeposition bath which contains zinc nitrate and is kept heated, and forming a zinc oxide film on the substrate by passing a current between the substrate and the opposing electrode; a second step of trapping the particles of zinc oxide precipitated in the electrodeposition bath by circulating or stirring the bath; and a third step of immersing another substrate and the opposing electrode in the electrodeposition bath which contains zinc nitrate and is kept heated, and forming a zinc oxide film on the another substrate by passing a current between the another substrate and the opposing electrode.

Further the present invention provides a process for electrodepositing a zinc oxide film, which comprises: a first step of immersing a substrate and an opposing electrode in an electrodeposition bath which contains zinc nitrate and is kept heated, and forming a zinc oxide film on the substrate by passing a current between the substrate and the opposing electrode; a second step of stopping passing the current to stop forming the zinc oxide film; a third step of trapping the particles of zinc oxide precipitated in the bath by circulating or stirring the electrodeposition bath; a fourth step of heating the electrodeposition bath after starting the third step; and a fifth step of immersing another substrate and the opposing electrode in the electrodeposition bath which contains zinc nitrate and is kept heated, and forming a zinc oxide film on the another substrate by passing a current between the another substrate and the opposing electrode.

DESCRIPTION OF THE PREFERRED EMBODIMENTS

Figure 1A:
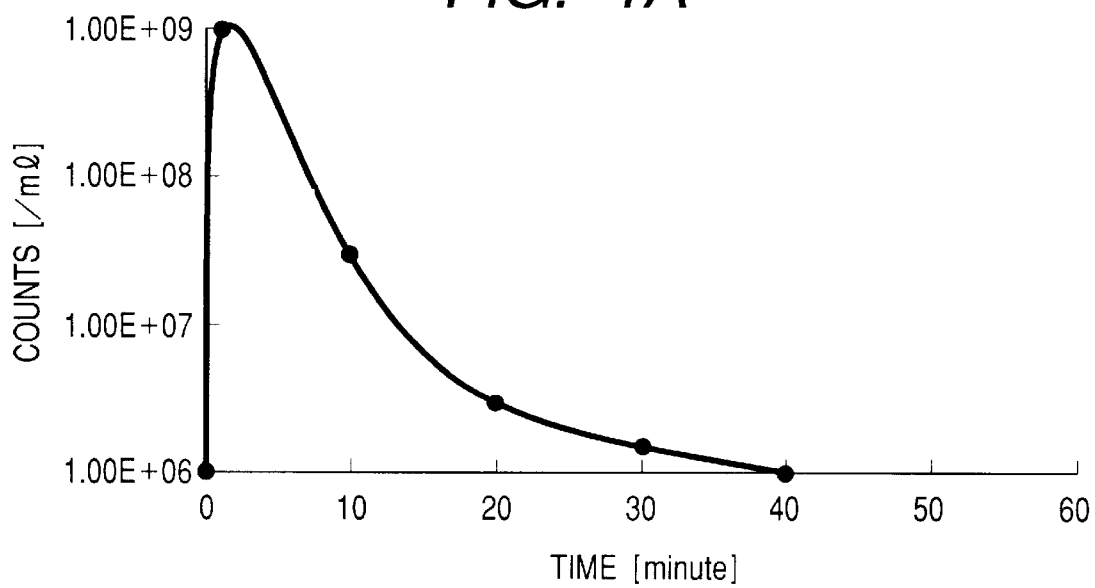
FIG. 1A is a graph showing changes in number of particles in an electrodeposition bath with elapse of time and FIG. 1B is a graph showing the relationship between the number of particles in an electrodeposition bath and the shunt of solar cells.

The present inventors investigated the following points using the electrodeposition apparatus shown in FIG. 2 and FIGS. 3 to 9.

A process of forming a zinc oxide film of 1 $\mu$m thick on a roll of long substrate 2006 of 1050 m long was repeated 10 times using the above electrodeposition apparatus with its first electrodeposition tank 2066 filled with an electrodeposition bath and second electrodeposition tank 2116 filled with pure water. As a result, white particles were produced, and they were trapped with a filter 2161. This white powder was identified by using an X-ray diffractometer (XRD), and a diffraction peak equal to that of ZnO powder shown in the JCPDS (Joint Committee on Powder Diffraction Standards) card was obtained and it was confirmed that the white powder was zinc oxide.

Then the operation of the apparatus was stopped and left overnight with its heater turned off; as a result, it was observed that the electrodeposition bath partly stagnated in the first electrodeposition tank 2066 with a precipitate of white zinc oxide powder about 1 mm thick formed on its bottom. When another roll of long substrate was set in the apparatus and the circulation and heating of the bath were started so as to subsequently form another zinc oxide thin film, the above precipitate was stirred up and the bath turned white and turbid. And the formation of a zinc oxide thin film under such conditions caused slight signs of "haze-like" stains on the portion of the zinc oxide thin film initially formed on the roll of long substrate, and numbers of portions at which the zinc oxide film was abnormally grown to several hundred $\mu$m or more thickness were observed under a scanning electron microscope (SEM). When forming solar cells having an amorphous silicon pin structure on such a zinc oxide thin film by using a small-area CVD apparatus, almost all the solar cells shunted, the cause of the shunt was found to be the abnormal growth of the electrodeposited zinc oxide film. Then, when visually checking the end portion of the roll of long substrate, at which a zinc oxide film could be formed under the conditions free from the white turbidity of the electrodeposition bath because film formation was continuously performed, the formed film was found to be uniform and abnormal growth of the film was not observed in almost all the SEM field of view. Further, when forming the same solar cells as above on the formed zinc oxide thin film, it was confirmed that the survival percent of the cells was 100%. Thus it was found that the powder floating in the bath affects the quality of the film to be formed.

Then, the powder floating in the bath was quantitatively examined. Since the number of the particles in question was much larger than that used in the quantitative examination for clean rooms, a simple method was newly developed for and applied to the present case. Specifically, 0.03 g of zinc oxide powder, from Japanese Pharmacopoeia, consisting of particles having an average diameter of 1 µm was taken and suspended in 10 ml of pure water to prepare a standard solution with $1.0 \times 10^9$ counts/ml. The standard solution looked white and turbid, and when it was taken in a test tube, the other side of the test tube could not be seen through it. The standard solution was diluted with pure water by a factor of 10 to prepare suspensions with $1.0 \times 10^8$ counts/ml, $1.0 \times 10^7$ counts/ml and $1.0 \times 10^6$ counts/ml. Visually, the suspension with $1.0 \times 10^7$ counts/ml managed to be recognized to be white (to such an extent that only secondary aggregated particles could be recognized) and the suspension with $1.0 \times 10^6$ counts/ml was almost transparent. Using these suspensions as reference suspensions, the particle density of the bath was decided with the naked eye.

The graph of FIG. 1A was constructed by plotting changes in number of the particles in the electrodeposition tank with elapse of time after stopping the operation of the electrodeposition apparatus. The initial sharp rise in number of the particles reflects the stirring up of the precipitated powder and the subsequent decrease in the number of the particles is attributed to the two factors: trapping of the particles in a filter and dissolving of the particles in the bath by heating. The graph of FIG. 1B was constructed by plotting the survival percent of the solar cells (the percentage of the solar cells which did not shunt) formed on the zinc oxide thin films formed from the baths with different numbers of particles.

Figure 1B:
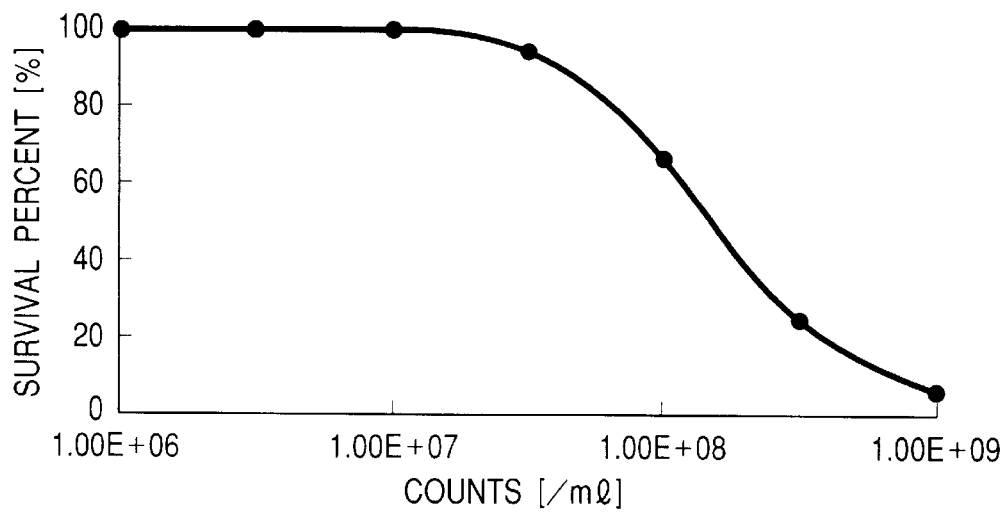

It is apparent from FIG. 1B that, in order to satisfy the specification required for devices, the number of the particles in the electrodeposition bath must be 30 million counts/ml or less in this electrodeposition process. It is also apparent from FIG. 1A that the bath has a particle density fully dealing with the device formation after 10 minutes or longer circulation. Further, it is apparent from the above discussion and FIG. 1A that for the film of which appearance alone is important, the bath may contain $1 \times 10^8$ counts/ml of particles, in other words, five-minute bath circulation is sufficient. Further it is apparent that in order to obtain a zinc oxide film on which almost no abnormal growth is observed under a SEM, the number of the particles in the bath must be $1 \times 10^6$ counts/ml or less, in other words, 40-minute or longer bath circulation should be carried out before the film formation.

In the following the electrodeposition apparatus of the present invention will be described in terms of the preferred embodiments, however, it should be understood that they are shown for illustrative purposes only and are not intended to limit the present invention.

The main components of the electrodeposition apparatus for use in the present embodiments are basically the same as those of the electrodeposition apparatus shown in FIG. 2 and FIGS. 3 to 9. Accordingly, the embodiments will be described conveniently with the reference numerals used in FIG. 2 and FIGS. 3 to 9.

Specifically the electrodeposition apparatus for use in the present embodiments is an apparatus for continuously forming a uniform oxide film on a long substrate 2006, the apparatus including: a wind-off unit 2012 for feeding the long substrate 2006 wound in a coil-like state; a first electrodeposition tank 2066 for depositing or treating a first electrodeposited film; a second electrodeposition tank 2116 for depositing or treating a second electrodeposited film; a first circulation tank 2120 for circulating and supplying a heated electrodeposition bath to the first electrodeposition tank; a second circulation tank 2222 for circulating and supplying a heated electrodeposition bath to the second electrodeposition tank 2116; a first waste-solution tank 2172 for temporarily storing the electrodeposition bath of the first electrodeposition tank for its drainage; a second waste-solution tank 2274 for temporarily storing the electrodeposition bath of the second electrodeposition tank for its drainage; a filter circulation system (a piping system connected to a first electrodeposition tank filter circulation filter 2161) for cleaning the electrodeposition bath within the first electrodeposition tank by removing the powder (particles) in the bath; a filter circulation system (a piping system using a second electrodeposition tank filter circulation filter 2263) for cleaning the electrodeposition bath within the second electrodeposition tank by removing the powder (particles) in the bath; a piping system for feeding compressed air for use in stirring the baths to the first and second electrodeposition tanks (a piping system starting with a compressed-air feed inlet 2182); a pure-water shower tank 2360 for cleaning the long substrate with a film electrodeposited thereon by using pure-water shower; a first hot-water tank 2361 for performing a first pure-water rinse cleaning; a second hot-water tank 2362 for performing a second pure-water rinse cleaning; a pure-water heating tank 2339 for supplying hot pure water needed to the above hot-water tanks; a drying section 2363 for drying the cleaned long substrate; a wind-up unit 2296 for winding up the long substrate on which film deposition has been completed again in a coil-like state; and an exhaust system (consisting of an electrodeposition water washing system exhaust duct 2020 or a drying system exhaust duct 2370) for the steam produced in the steps of heating the electrodeposition bath and pure water or of drying the long substrate.

Figure 2:
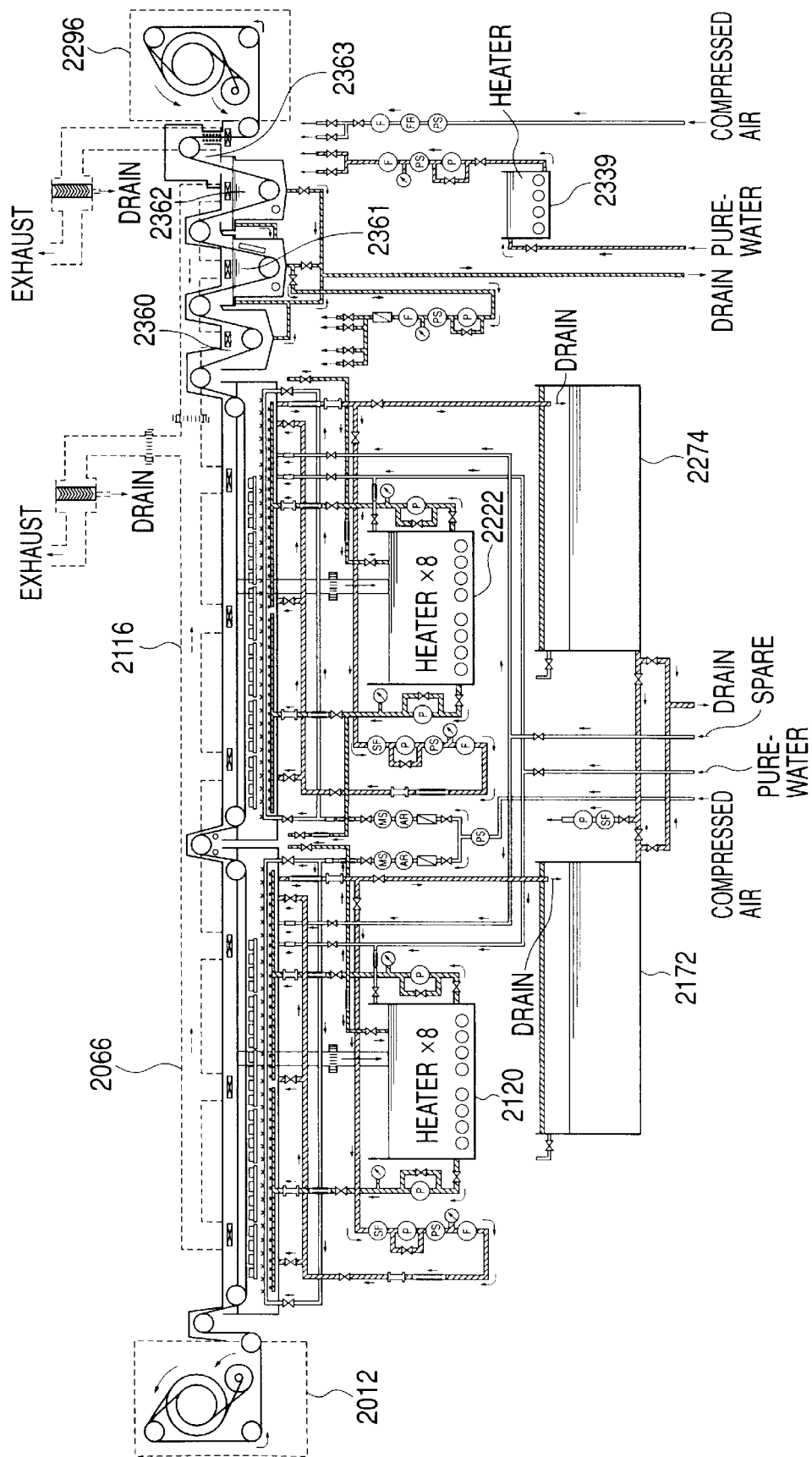
FIG. 2 is a schematic view of one example of long substrate electrodeposition apparatus to which the present invention is applicable.
Figure 3:
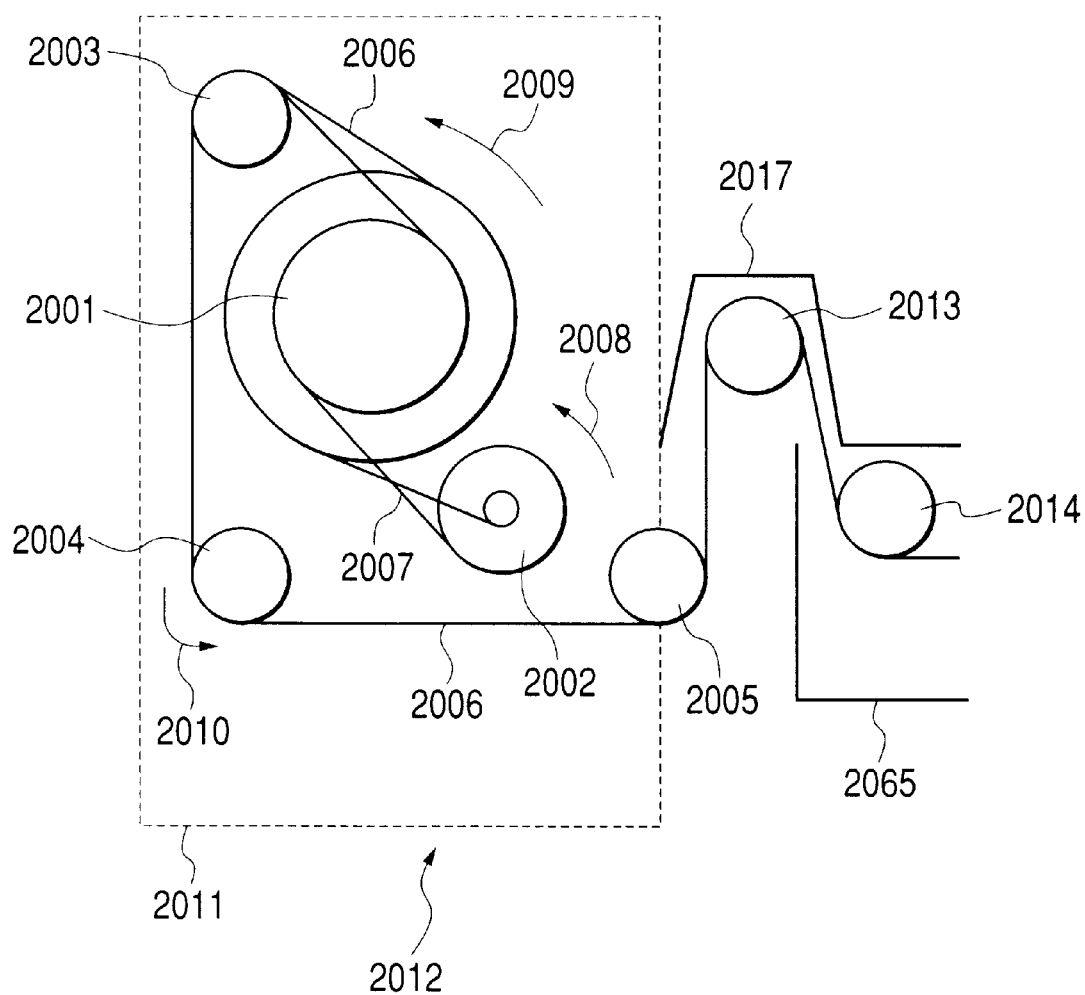
FIG. 3 is a schematic view of a wind-off unit in the long substrate electrodeposition apparatus of FIG. 2.
Figure 4:
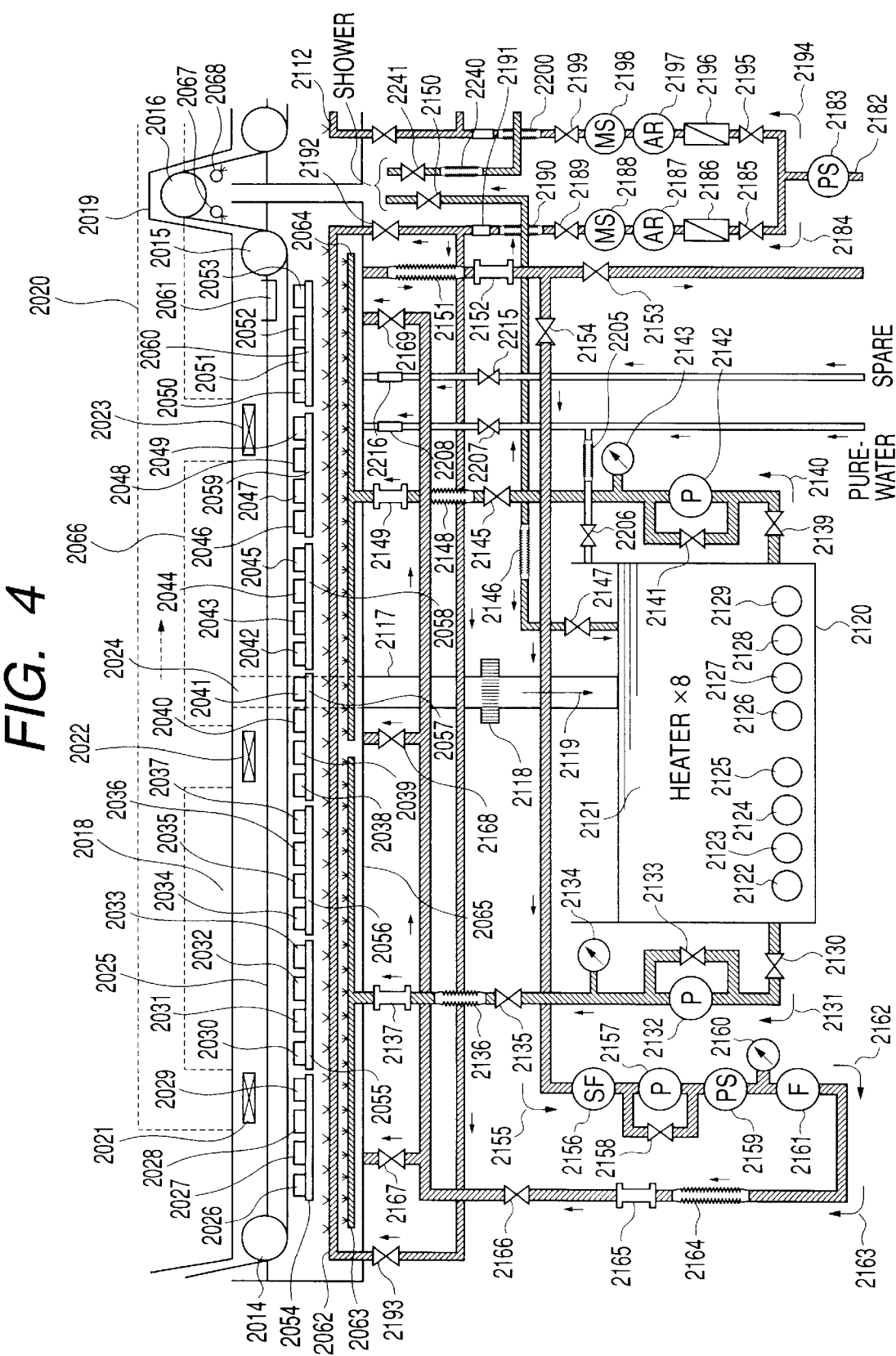
FIG. 4 is a schematic view of a first circulation tank in the long substrate electrodeposition apparatus of FIG. 2.
Figure 5:
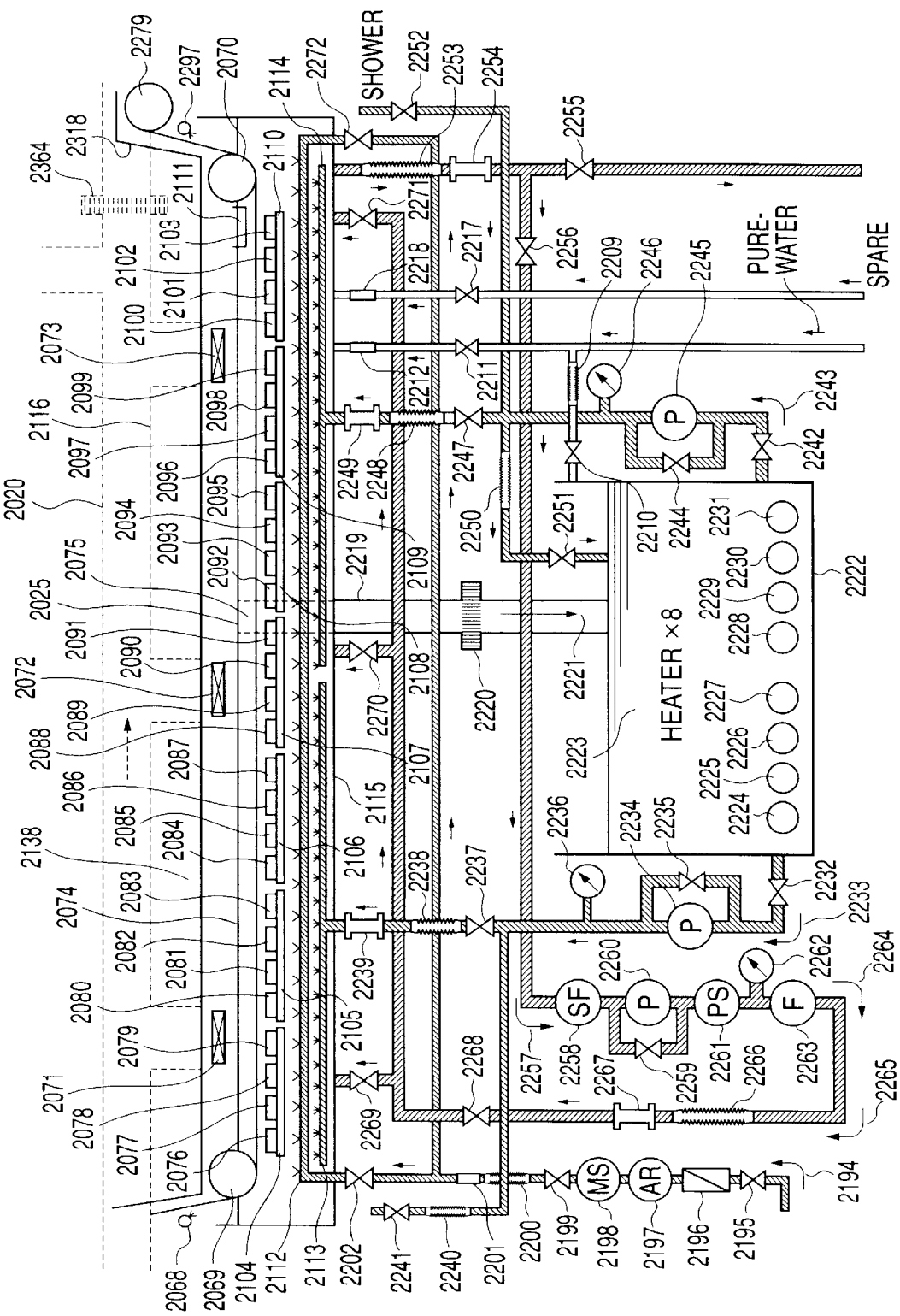
FIG. 5 is a schematic view of a second circulation tank in the long substrate electrodeposition apparatus of FIG. 2.
Figure 6:
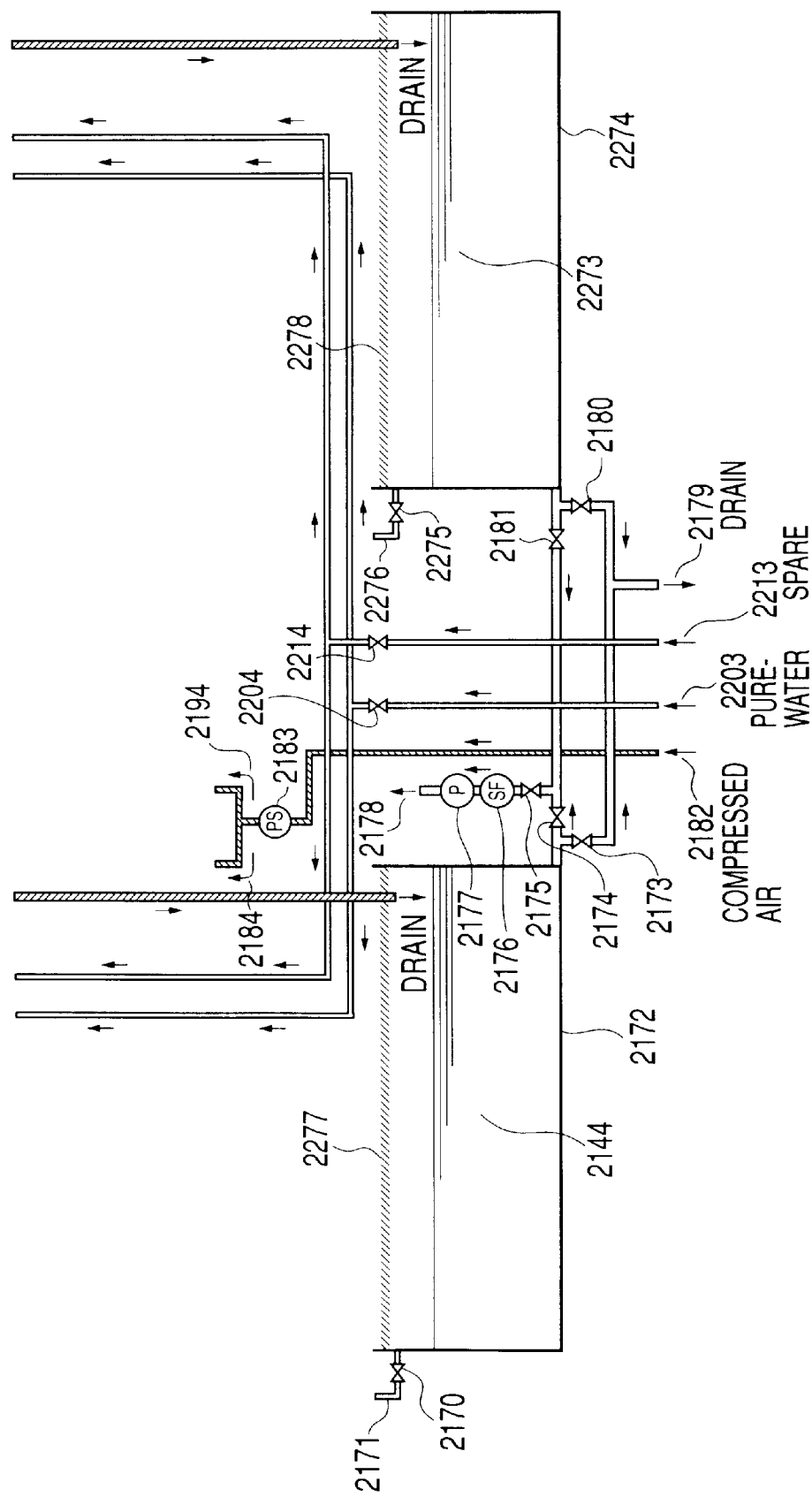
FIG. 6 is a schematic view of first and second wastesolution tanks in the long substrate electrodeposition apparatus of FIG. 2.
Figure 7:
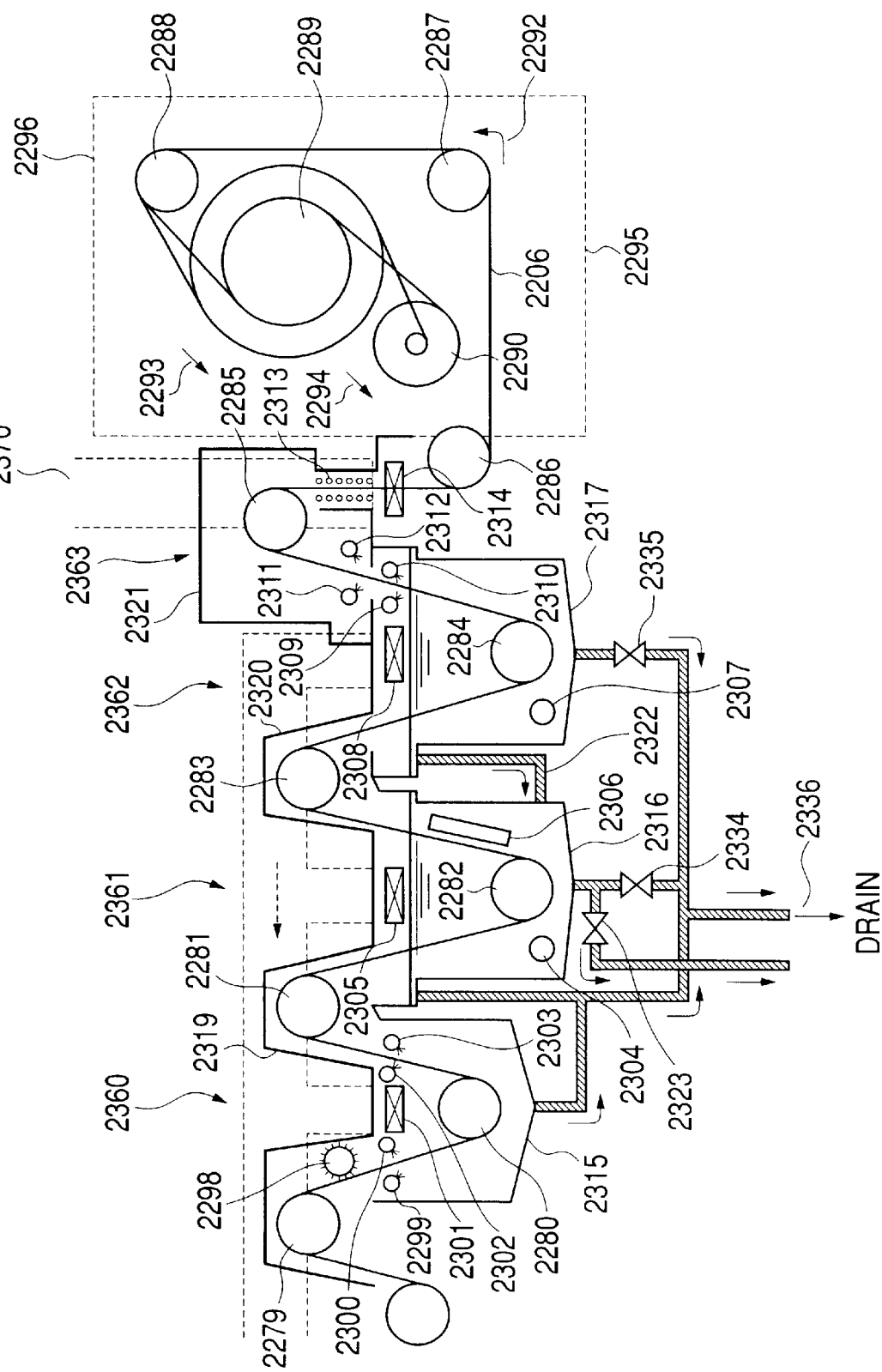
FIG. 7 is a schematic view of a pure-water shower tank, first and second hot-water tanks, a drying unit and a wind-up unit in the long substrate electrodeposition apparatus of FIG. 2.
Figure 8:
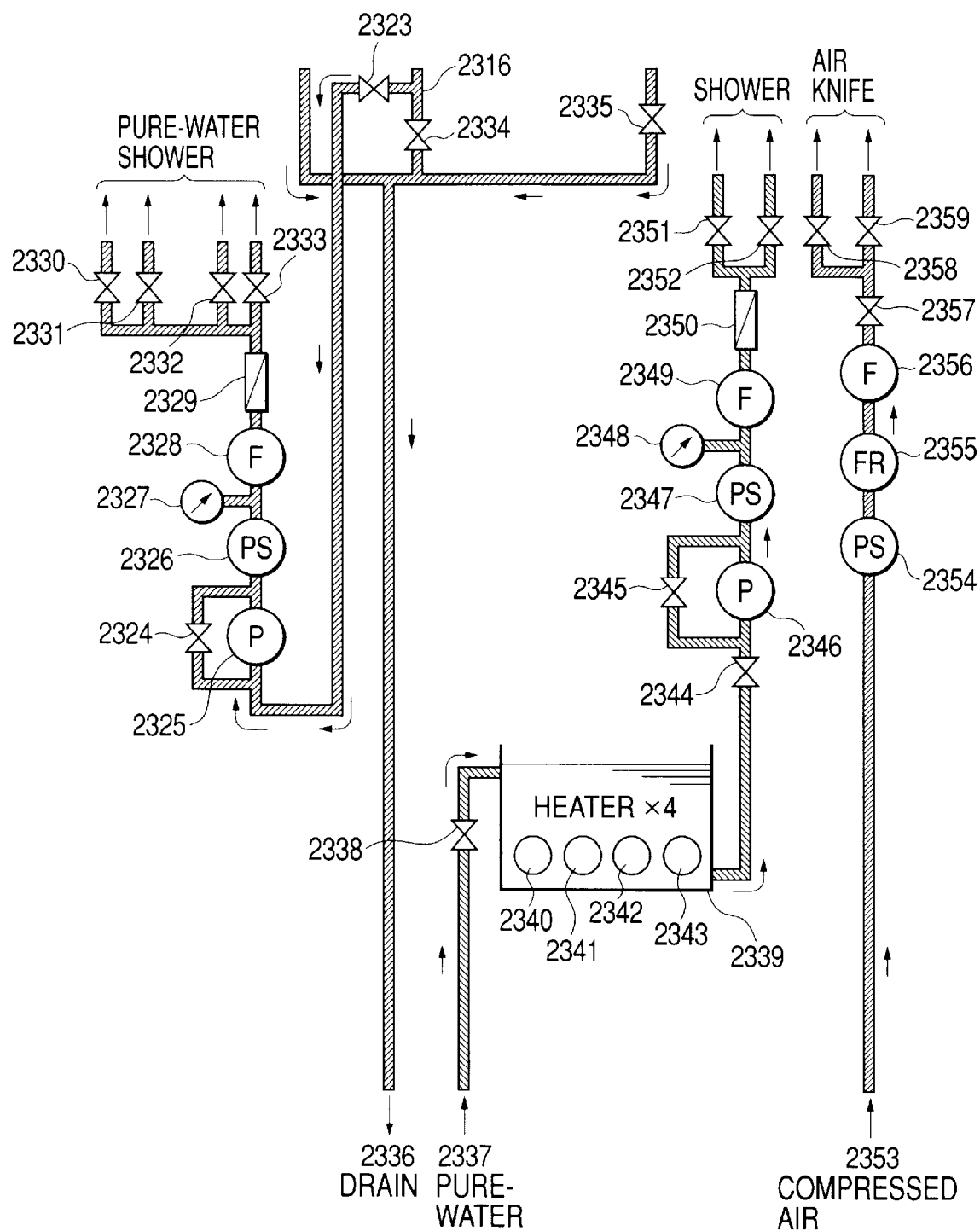
FIG. 8 is a schematic view of a pure-water heating tank, etc. in the long substrate electrodeposition apparatus of FIG. 2.
Figure 9:
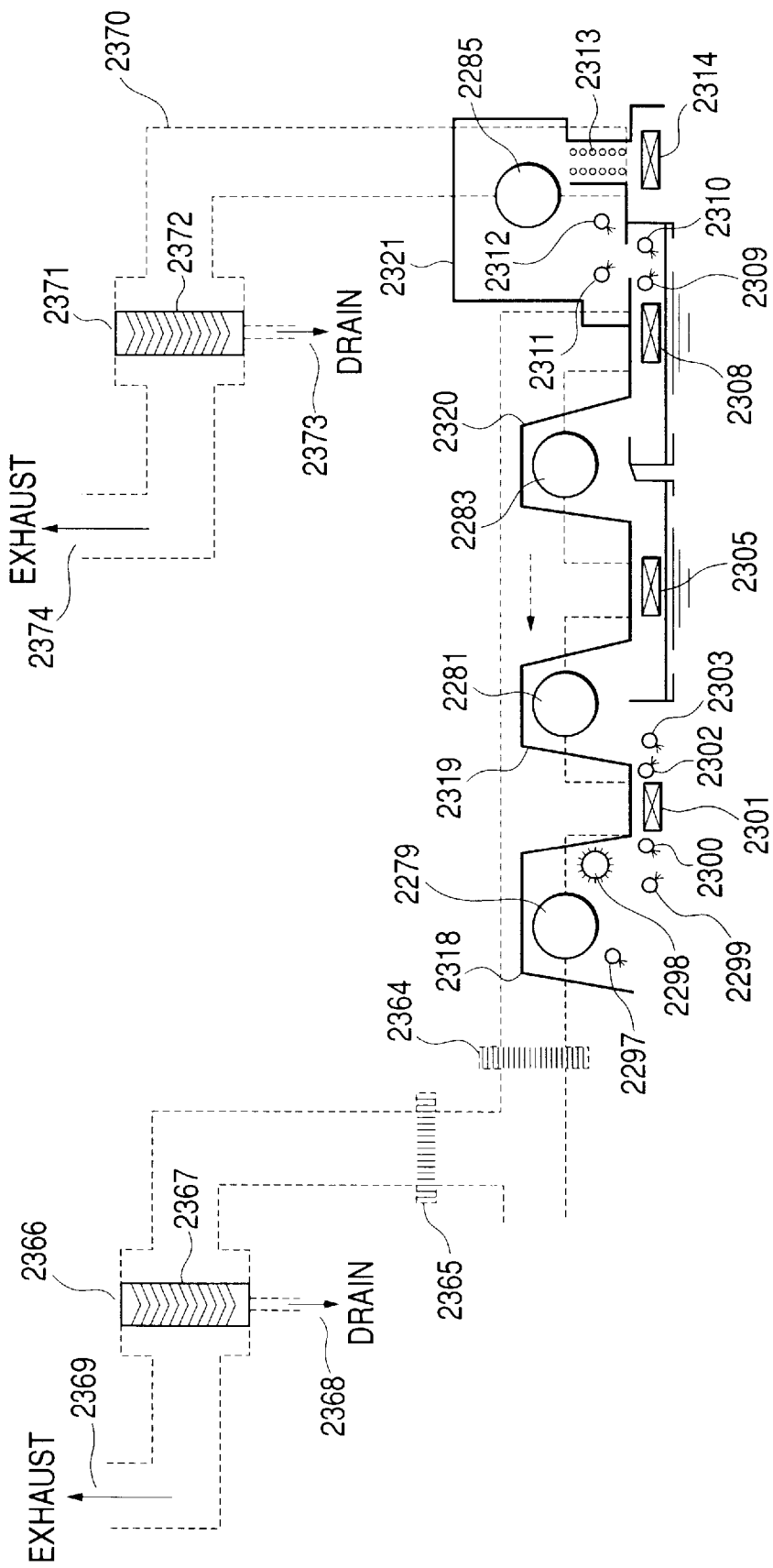
FIG. 9 is a schematic view of a drainage system, etc. in the long substrate electrodeposition apparatus of FIG. 2.

As the electrodeposition apparatus used in the present embodiments, a roll-to-roll type electrodeposition apparatus is adopted in which the long substrate 2006 is transported between rolls in a state where the substrate is wound off from the substrate wound in one roll and is wound up in another roll; specifically, the long substrate 2006 wound in one roll is transported from the left side to the right side of FIG. 2 through the wind-off unit 2012, the first electrodeposition tank 2066, the second electrodeposition tank 2116, the pure-water shower tank 2360, the first hot-water tank 2361, the second hot-water tank 2362, the drying section 2363 and the wind-up unit 2296 in this order, so that the substrate has a film electrodeposited thereon.

The process for electrodepositing a zinc oxide film according to the present invention which uses the above described apparatus is carried out in such a manner that it forms a zinc oxide thin film on the substrate 2006 by immersing the substrate 2006 and opposing electrodes 2026 to 2053 and 2076 to 2103 in the electrodeposition bath (the electrodeposition bath of the first circulation tank 2120 and of the second electrodeposition tank 2116) which contains zinc nitrate and is kept heated at 50° C. or higher and passing a current between the substrate 2006 and the opposing electrodes 2026 to 2053 and 2076 to 2103. In the process for electrodepositing a zinc oxide film according to the present invention, a step of circulating or stirring the electrodeposition bath and trapping the particles of the zinc oxide precipitated in the bath is carried out prior to the formation of the zinc oxide thin film. In the apparatus shown in FIG. 2, the circulation or stirring of the electrodeposition bath is preferably carried out by, for example, jetting or air-bubbling the electrodeposition bath; however, the circulating or stirring methods applicable to the present invention are not limited to the above ones. And in the step of trapping the zinc oxide particles, the number of the particles having a diameter of 1 μm or more in the electrodeposition bath is preferably 30 million counts per 1 ml.

The zinc oxide particles are preferably trapped with the filter provided in the middle of the circulation mechanisms (pumps and piping).

The step of trapping the zinc oxide particles (for example, filtering by the operation of the circulation pumps) is preferably started before starting to heat the electrodeposition bath. This provides more efficient trapping.

In the following, the electrodeposition apparatus carrying out the electrodeposition process of the present embodiments will be described in detail in terms of its components and operational conditions.

[Substrate]

Any substrates can be used as long as they can have oxide deposited thereon; however, in view of productivity, a long substrate (also, referred to as, for example, "roll substrate", "web", "hoop material", "coil", "tape" or "reel material") is preferably used. The term "long substrate" herein used means a very long and narrow rectangular thin plate which can be longitudinally wound up and be held in the form of a roll. From the industrial viewpoint, a long substrate offers the advantages of high operation rate, low running cost, etc. because they allow continuous film formation. While the present invention has been described in terms of the cases where a long substrate is used, it is to be understood that the present invention is not intended to be limited to such cases.

As the materials for the substrate, any materials can be used as long as their surface on which a film is to be formed allows current to flow and they are not attacked by the electrodeposition bath. For example, not only metals such as stainless steel plate (SUS), Al, Cu and Fe, but also PET films coated with metals can be used. Of the above materials, SUS is superior as the long substrate when carrying out the device forming process in the post-processing step.

As SUS, both non-magnetic and magnetic SUS are applicable. The typical example of the former is austenitic SUS 304, which is excellent in polishing qualities and from which a mirror finish as smooth as 0.1 s can be obtained. The typical example of the latter is ferritic SUS 430, which is effectively used in the transportation utilizing a magnetic force.

The surface of the substrate may be either smooth or rough. The surface characteristics vary depending on the type of roller used in the rolling process of SUS. The surface referred to as "BA" is closed to a mirror finished surface and that referred to as "2D" is a remarkably rough surface. In any surfaces, there are sometimes observed noticeable scoops in micron units under an SEM (scanning electron microscope). In the solar cell substrates, structures in micron units rather than large undulatory roughness largely affect the characteristics of solar cells in either a good way or a bad way.

Further, such substrates may have a film of another conductive material formed thereon, and whether they should have such a film or not is selected depending on the object of the electrodeposition. In some cases, an extremely thin layer of zinc oxide is preferably formed on the substrate previously by using another process, since the formation of such a layer allows a stable improvement in deposition rate in the electrodeposition process. Low costs are the merit of the electrodeposition process, indeed, but even if additionally adopting a somewhat costly process, using the two types of process jointly is advantageous, as long as it is possible to lower costs on the whole.

[Electrodeposition Bath]

As the electrodeposition bath, basically those having been checked in small laboratory equipment such as, for example, beakers can be used. For the a rough deposited layer of zinc oxide having the optical confinement effect and is applied to the undercoating layer of a solar cell, the solutions of the prior arts can be used. When electrodepositing zinc oxide, the combination of zinc nitrate and an additive is satisfactorily used; and when the additive is a saccharide, the uniformity of the electrodeposited film is improved. In particular, the use of dextrin is significantly effective.

When the electrodeposition bath is at a high temperature and a significant amount of steam is generated, preferably exhaust ducts are provided through which the steam can be sucked, as shown in FIG. 2, because such exhaust ducts can prevent the steam and water droplets as the condensate of the steam from leaking out through the gaps of the apparatus. And such exhaust ducts should be provided particularly when the tanks are provided with lids, which are not shown in the drawings. It is dangerous to take off the lids if there are provided no exhaust ducts, because steam shoots forth from the tanks at the moment the lids are taken off. When the amount of the bath decreases due to the generation of steam and exhaust by suction, the tanks are periodically replenished with pure water.

[Electrodeposition Conditions]

When carrying out the electrodeposition, an electrochemical reaction is driven while applying a negative voltage to the long substrate and a positive voltage to anodes. To control the film thickness, suitably the electrodeposition is carried out while controlling current. The current is preferably specified by the current density and is set to be in the range of 0.3 to 100 mA/cm$^2$.

[Anode]

As the anodes, zinc plates of purity 2N or 4N, as soluble anodes, can be used. When the surfaces of the zinc plates are contaminated, they should be lightly cleaned with dilute nitric acid. The feeder lines to the anodes are preferably tightened with SUS bolts because reliable electrical contact is ensured for a long period of time. As insoluble anodes, for example, SUS, Pt, etc. can also be used.

Wrapping soluble anodes in anode bags is preferable, because anode bags can prevent the generated zinc oxide powder form dusting in the electrodeposition bath. As the materials for the anode bags, cotton and an amide resin fiber, which are not attacked in the bath, can be used and preferably they are used in the form of a proper mesh. The mesh size is determined so as to bring the electrodeposition bath into contact with the surface of the anodes without failure and specify the maximum size of the dusting particles. The mesh size of 0.5 mm to several mm is usually selected.

[Transporting Rate]

The transporting rate of the substrate is determined solely considering the right balance between the required thickness of the electrodeposited film and the film deposition rate. In actuality, there are 56 anodes in all in the first electrodeposition tank 2066 and the second electrodeposition tank 2116, and the transporting rate of the long substrate is determined by totaling each film deposition rate.

The apparatus shown in FIG. 2 is designed in such a manner that the transporting rate is in the range of 0.5 m/min to 5 m/min. And some experiments proved that zinc oxide can be deposited on a long substrate 500 m or more long at a heating temperature of 85° C. even at the minimum and maximum transporting rates as shown above, as long as the transporting state is kept satisfactory.

[Pump]

Basically the pumps used for circulating the bath are required to gain a sufficient flow rate, but on the other hand, when arranging them, the occurrence of cavitation must be considered. Particularly at temperatures of 90° C. or higher, the water evaporates all at once due to the negative pressure applied for sucking the bath, and the phenomenon of cavitation is likely to occur in which a gas spins around the pumping fins within the pumps. Once the cavitation occurs, the pumps start to idle, thereby often resulting in scoring and damage such as cracks of the fins. In order to prevent this phenomenon from occurring, the pumps should be arranged at as a low position as possible so that the bath can be pressed thereinto, in other words, a negative pressure is hard to be generated.

[Filter]

The filters used in the bath system are roughly classified into two types: filters for removing particles of about submicron to 10 microns, which are exemplified by cartridge filters; and suction filters (basically metal screens) for removing dirts of diameter several millimeters or more. The particle-removing filters are needed so as to positively remove the powder generated form the bath system within the apparatus, and this filter size determines the size of the dirts remaining on the film formed on the long substrate which is finally to be wound up. Accordingly, the necessary filter size depends on the characteristics which the formed film is required to have. The suction filters are used for preventing damage to pumps and valves. The filters used in the air system are mainly for removing oil mist and moisture mixed in the compressed air.

[Amount of Circulating Bath]

In order to uniform the temperature and concentration of the bath to be used, the sufficient amount of circulating bath should be ensured. Several tens liters/min of circulating bath is sufficient for the several hundreds liters of bath. Preferably the circulating bath moves on the surfaces of the anodes and substrate, so as to form a flow with which a fresh bath is always supplied thereto. When a sufficient amount of the circulating bath is ensured, the circulating bath can form jets in the electrodeposition tank and be of help to stirring of the bath.

[Stirring Air Amount]

Stirring by the air is not necessarily indispensable; however, when the amount of the circulating bath is not very large, it becomes an extremely effective means of stirring the bath. When using this means, the flow rate is preferably about several m$^3$/hr or more for several hundreds liters of the bath. Preferably the stirred air is released through small valves so as to enhance the stirring effect. For this purpose, the apparatus can be designed in such a manner that the stirred air is shot from its orifices into the bath when applying a pressure of about $5 \times 10^5$ Pa to $1 \times 10^6$ Pa, for example, as shown in FIG. 2. If the air is accumulated under the substrate, not only the electrodeposition reaction but also the film formation does not progress; accordingly, it is necessary for the shot air not to lay stagnant but to float up.

[Piping]

The diameter of the piping used is determined by the flow rate of the circulating bath required, and for the portions which require a large flow rate, pipes of 40A or more in nominal diameter are desirably selected. In the actual apparatus shown in FIG. 2, for the portions shown as big pipes, pipes of 40A in nominal diameter are used and for the portions shown as small pipes, those of 25A in nominal diameter are used. For the materials of the pipes, the use of stainless steel satisfies extremely favorable conditions; however, when electrical contact is not good, pipes of heat-resistant vinyl chloride can be partly used. As for the joints between the pipes, for the small pipes and the pipes of the same material, inserts are satisfactorily used; however, for the joints between the big pipes of vinyl chloride and stainless steel, flanged joints are preferably used so as to prevent the liquid from leaking after the repetition of thermal expansion and shrinkage.

In the following, the examples of the present invention will be described with reference to the accompanying drawings.

EXAMPLE 1

A zinc oxide film was formed by electrodeposition process on each of 10 rolls of a long SUS substrate of 1050 m long by using the apparatus shown in FIG. 2, then the apparatus was allowed to be idle overnight. Then another roll of a long SUS substrate was set, and before forming a zinc oxide thin film by the electrodeposition process, pre-circulation was started. Then the switch of the heaters in the circulation tanks was turned on, the electrodeposition bath was heated to 85° C., and ten-minute pre-circulation of the bath was carried out without air-stirring. After the pre-circulation, deposition of a zinc oxide thin film by the electrodeposition process was started while applying a current to the anodes, at the same time that the transportation of the long SUS substrate was started. On the zinc oxide thin film thus obtained, an active layer of pin triple structure consisting mainly of amorphous silicon and an ITO layer were formed one by one by using a roll type CVD apparatus and then a roll type sputtering apparatus. The solar cells formed on the substrate and wounded in a roll were cut off, and the survival percent of the solar cells was determined by the sampling inspection. Special care was taken of observing whether or not there was difference in survival percent between the first half of the roll and the second half of the roll. However, the both survival percentages fell within the range of 94 to 100% and there was no significant difference between them.

Comparative Example 1

Comparative Example 1 was carried out for comparing with Example 1, and a zinc oxide film was formed in almost the same manner as Example 1. It was different from Example 1 in that before forming a zinc oxide thin film by the electrodeposition process and after the switch of the heaters in the circulation tanks was turned on and the electrodeposition bath was heated to 85° C., pre-circulation of the bath was not carried out. The solar cells were formed in the same manner as Example 1 and the survival percent of the solar cells was determined by the sampling inspection. The survival percent was low particularly at the portion of the roll corresponding to the zinc oxide film initially formed, and at some portions, it was as low as less than 60%. On the other hand, the survival percent of the second half of the roll was satisfactory, at almost all the portions, it was 100%, and at only a few portions, it was 96 to 98%.

It is apparent from the comparison of Example 1 and Comparative Example 1 that the present invention is effective. In cases where the characteristics of a formed device are known only after the completion of a process subsequent to the formation of the device, like the present example, the loss resulting from the decrease in yield is much larger than that resulting from the decrease in operation rate due to only few-minute waiting time, and in this respect, the present invention is of great significance.

EXAMPLE 2

Pre-circulation was carried out in the same manner as Example 1, except for starting pre-circulation, turning on the switch of the heaters in the circulation tanks, heating the electrodeposition bath to 85° C. and then carrying out seven-minute pre-circulation of the bath in addition to air-stirring. Solar cells were formed on the zinc oxide thin film formed on the roll (long substrate) in the same manner as Example 1. The results of the sampling inspection were such that there was no significant difference in survival percent of solar cells between the first half of the roll and the second half of the same and the survival percentages all fell in the range of 96% to 100%, just like Example 1. This example revealed that satisfactory stirring of the bath allows reducing of the time required for pre-circulation.

EXAMPLE 3

Similarly as in Example 1, a zinc oxide thin film was formed on each of 10 rolls of a long SUS substrate by the electrodeposition process, then the apparatus was allowed to be idle overnight. On the bottom of the electrodeposition tanks, white powder of zinc oxide precipitate was observed. Then another long SUS substrate roll was set, and before forming a zinc oxide thin film by the electrodeposition process, the switch of the heaters in the circulation tanks was turned on, the electrodeposition bath was heated to 85° C., and pre-circulation of the bath was carried out without air-stirring. After starting the pre-circulation, the electrodeposition bath was sampled every 30 seconds and taken in test tubes, and the samples were compared visually with the standard solution having been prepared for comparing the particle number, which has been described in the section of the present inventors' means for solving the problems. Since the number of the particles in the sample taken at the time 9 minutes passed was midway between $1\times10^8$ counts/ml and $1\times10^7$ counts/ml (slightly close to $1\times10^7$ counts/ml), deposition of a zinc oxide thin film by the electrodeposition process was started at the same time that the transportation of the long SUS substrate was started, while applying a current to the anodes. On the zinc oxide thin film thus obtained, solar cells were formed on the substrate and were wound in a roll in the same manner as Example 1. The formed solar cells were cut off, and the survival percent of the solar cells was determined by the sampling inspection. Special care was taken of observing whether or not there was difference in survival rate between the first half of the roll and the second half of the roll. However, the both survival percentages fell within the range of 94 to 100% and there was no significant difference between them, like Example 1.

It is apparent from Example 3 that direct observation of the number of the particles in the bath also allows judging of the degree to which pre-circulation is carried out. In the present example, the number of the particles was judged visually by using a reference sample; however, in order to further increase the precision, measuring instruments for scatter, concentration, turbidity, etc. can also be used. What is called particle counters can also be used; however, since commercially available particle counters are too sensitive, they may sometimes be unsuitable for counting the particles dealt with in the present invention. In such a case, the samples may be diluted by a factor of 10 to the several power. When diluting the samples, however, the diluent containing as small a number of particles as possible such as pure water must be used and the amount of the dust mixed in from not only the instruments and tubes for dilution but also from the environment must be minimized.

As described so far, the use of the process for electrodepositing a zinc oxide film according to the present invention allows forming of a uniform zinc oxide thin film, which is applicable to semiconductor devices such as solar cells, on a long substrate, and in addition, providing a zinc oxide film of a high survival percent. Furthermore, the optimized simple means of the present invention allows minimizing of the abnormal growth of the zinc oxide film, which is the cause of lowering the survival percent, particularly for the film initially formed on the long substrate.

The number of the particles in the bath is made 30 million counts/ml at the time when starting the operation after allowing the apparatus to be idle; therefore, the present invention can provide the optimized means for minimizing the abnormal growth of the zinc oxide film which is the cause of lowering survival percent.

What is claimed is:

1. A process for electrodepositing a zinc oxide film, comprising the steps of: immersing a substrate and an opposing electrode in an electrodeposition bath which contains zinc nitrate and is kept heated; and forming a zinc oxide film on the substrate by flowing a current between the substrate and the opposing electrode, wherein the process further comprises a step of trapping particles of zinc oxide precipitated in the electrodeposition bath by circulating or stirring the bath before the formation of the zinc oxide film and a step of increasing the temperature of the electrodeposition bath after starting the step of trapping the particles of zinc oxide.

2. The process according to claim 1, wherein the circulation or stirring of the electrodeposition bath is carried out by causing a jet in the electrodeposition bath.

3. The process according to claim 1, wherein the circulation or stirring of the electrodeposition bath is carried out by causing air-bubbling in the electrodeposition bath.

4. The process according to claim 1, wherein the number of the particles having a diameter of 1 $\mu$m or more in the electrodeposition bath is decreased to 30 million counts per ml or less in the step of trapping the particles of zinc oxide.

5. The process according to claim 1, wherein a long substrate is used as the substrate.

6. The process according to claim 1, wherein a roll-to-roll system is adopted in which a long substrate is transported as the substrate in a state where the substrate is wound off from the substrate wound in a roll and is wound up in another roll.

7. A process for electrodepositing a zinc oxide film, comprising:

a first step of immersing a substrate and an opposing electrode in an electrodeposition bath which contains zinc nitrate and is kept heated, and forming a zinc oxide film on the substrate by flowing a current between the substrate and the opposing electrode;

a second step of trapping particles of zinc oxide precipitated in the electrodeposition bath by circulating or stirring the bath;

a third step of increasing the temperature of the electrodepostion bath after starting the step of trapping the particles of zinc oxide; and a fourth step of immersing the same substrate or another substrate and the opposing electrode in the electrodeposition bath which contains zinc nitrate and is kept heated, and forming a zinc oxide film on the same or another substrate by passing a current between the same or another substrate and the opposing electrode.

8. A process for electrodepositing a zinc oxide film, comprising:

a first step of immersing a substrate and an opposing electrode in an electrodeposition bath which contains zinc nitrate and is kept heated, and forming a zinc oxide film on the substrate by flowing a current between the substrate and the opposing electrode;

a second step of stopping passing the current to stop formation of the zinc oxide film and decreasing a temperature of the electrodeposition bath;

a third step of trapping particles of zinc oxide precipitated in the bath by circulating or stirring the electrodeposition bath;

a fourth step of heating the electrodeposition bath after starting the third step; and a fifth step of immersing the same substrate or another substrate and the opposing electrode in the electrodeposition bath which contains zinc nitrate and is kept heated, and forming a zinc oxide film on the same or another substrate by passing a current between the same or another substrate and the opposing electrode.

* * * * *

UNITED STATES PATENT AND TRADEMARK OFFICE
CERTIFICATE OF CORRECTION

PATENT NO. : 6,632,346 B2
DATED : October 14, 2003
INVENTOR(S) : Kozo Arao et al.

It is certified that error appears in the above-identified patent and that said Letters Patent is hereby corrected as shown below:

<u>Title page,</u>
Item [75], Inventors, "Kozo Arao, Tokyo (JP);" should read -- Kozo Arao, California (USA); --.

Signed and Sealed this

Thirtieth Day of March, 2004

JON W. DUDAS
*Acting Director of the United States Patent and Trademark Office*